(12) United States Patent
Tsurume et al.

(10) Patent No.: US 8,822,272 B2
(45) Date of Patent: Sep. 2, 2014

(54) SEMICONDUCTOR DEVICE, MANUFACTURING METHOD THEREOF, AND MEASURING METHOD THEREOF

(75) Inventors: Takuya Tsurume, Tochigi (JP); Etsuko Asano, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 147 days.

(21) Appl. No.: 11/885,958

(22) PCT Filed: Mar. 17, 2006

(86) PCT No.: PCT/JP2006/005889
§ 371 (c)(1),
(2), (4) Date: Sep. 10, 2007

(87) PCT Pub. No.: WO2006/104019
PCT Pub. Date: Oct. 5, 2006

(65) Prior Publication Data
US 2008/0277660 A1    Nov. 13, 2008

(30) Foreign Application Priority Data
Mar. 28, 2005 (JP) .................................. 2005-093295

(51) Int. Cl.
*H01L 29/36*    (2006.01)
(52) U.S. Cl.
USPC ............ 438/110; 438/118; 438/124; 438/127
(58) Field of Classification Search
CPC .. A61B 5/0031; H01L 27/1214; H01L 27/12; H01L 35/34; H01L 45/1253
USPC ......... 438/14, 15, 22–24, 33, 51, 55, 64, 106, 438/124–127, 463, 464, 110–115, 118–119
See application file for complete search history.

(56) References Cited

U.S. PATENT DOCUMENTS 5,821,138 A    10/1998 Yamazaki et al.
5,899,729 A *  5/1999  Lee .............................. 438/460
(Continued)

FOREIGN PATENT DOCUMENTS

EP    1435653 A    7/2004
JP    05-074890    3/1993
(Continued)

OTHER PUBLICATIONS

International Search Report (Application No. PCT/JP2006/305889) dated Jun. 27, 2006.
(Continued)

*Primary Examiner* — H Tsai
(74) *Attorney, Agent, or Firm* — Eric J. Robinson; Robinson Intellectual Property Law Office, P.C.

(57) ABSTRACT

To provide a semiconductor device capable of being easily subjected to a physical test without deteriorating characteristics. According to a measuring method of a semiconductor device in which an element layer provided with a test element including a terminal portion is sealed with first and second films having flexibility, the first film formed over the terminal portion is removed to form a contact hole reaching the terminal portion; the contact hole is filled with a resin containing a conductive material; heating is carried out after arranging a wiring substrate having flexibility over the resin with which filling has been performed so that the terminal portion and the wiring substrate having flexibility are electrically connected via the resin containing a conductive material; and a measurement is performed.

12 Claims, 20 Drawing Sheets

(56) References Cited

U.S. PATENT DOCUMENTS

| | | | |
|---|---|---|---|
| 6,228,684 B1* | 5/2001 | Maruyama | 438/113 |
| 6,246,616 B1* | 6/2001 | Nagai et al. | 365/200 |
| 6,288,558 B1* | 9/2001 | Zimmermann et al. | 324/754 |
| 6,596,569 B1* | 7/2003 | Bao et al. | 438/151 |
| 6,736,918 B1* | 5/2004 | Ichikawa et al. | 156/182 |
| 6,881,597 B2 | 4/2005 | Asayama et al. | |
| 7,029,960 B2 | 4/2006 | Hashimoto et al. | |
| 7,122,445 B2 | 10/2006 | Takayama et al. | |
| 7,332,381 B2 | 2/2008 | Maruyama et al. | |
| 7,335,573 B2 | 2/2008 | Takayama et al. | |
| 7,351,300 B2 | 4/2008 | Takayama et al. | |
| 7,408,207 B2 | 8/2008 | Hashimoto et al. | |
| 7,612,753 B2 | 11/2009 | Koyama | |
| 7,723,209 B2 | 5/2010 | Maruyama et al. | |
| 2001/0017372 A1 | 8/2001 | Koyama | |
| 2002/0003980 A1 | 1/2002 | Takano et al. | |
| 2002/0039802 A1* | 4/2002 | Ban et al. | 438/14 |
| 2002/0103441 A1* | 8/2002 | Matsumura et al. | 600/509 |
| 2003/0032210 A1 | 2/2003 | Takayama et al. | |
| 2003/0127704 A1* | 7/2003 | Kobayashi et al. | 257/531 |
| 2003/0140485 A1* | 7/2003 | Yamazaki et al. | 29/740 |
| 2003/0219969 A1* | 11/2003 | Saito et al. | 438/622 |
| 2004/0038471 A1* | 2/2004 | Sakamoto et al. | 438/200 |
| 2004/0164302 A1 | 8/2004 | Arai et al. | |
| 2004/0165362 A1* | 8/2004 | Farnworth | 361/764 |
| 2004/0184131 A1 | 9/2004 | Kurashina | |
| 2004/0227251 A1* | 11/2004 | Yamaguchi | 257/777 |
| 2005/0024073 A1* | 2/2005 | Kim et al. | 324/762 |
| 2005/0024433 A1* | 2/2005 | Cruz-Uribe et al. | 347/50 |
| 2005/0031861 A1* | 2/2005 | Matsumura et al. | 428/354 |
| 2005/0042838 A1* | 2/2005 | Garyainov et al. | 438/455 |
| 2005/0148121 A1* | 7/2005 | Yamazaki et al. | 438/149 |
| 2005/0167666 A1* | 8/2005 | Onozuka et al. | 257/66 |
| 2006/0145860 A1* | 7/2006 | Brown et al. | 340/572.7 |
| 2009/0239320 A1 | 9/2009 | Takayama et al. | |
| 2010/0248402 A1 | 9/2010 | Maruyama et al. | |

FOREIGN PATENT DOCUMENTS

| | | |
|---|---|---|
| JP | 11-020360 | 1/1999 |
| JP | 2001-155134 | 6/2001 |
| JP | 2001-260580 | 9/2001 |
| JP | 2001-331120 | 11/2001 |
| JP | 2001-349905 A | 12/2001 |
| JP | 2002-152076 | 5/2002 |
| JP | 2002-217258 | 8/2002 |
| JP | 2003-195787 A | 7/2003 |
| JP | 2003-303379 | 10/2003 |
| JP | 2004-214281 A | 7/2004 |
| JP | 2004-228373 A | 8/2004 |
| JP | 2004-302417 | 10/2004 |
| JP | 2004-359363 | 12/2004 |

OTHER PUBLICATIONS

Written Opinion (Application No. PCT/JP2006/305889) dated Jun. 27, 2006.

* cited by examiner

SEMICONDUCTOR DEVICE, MANUFACTURING METHOD THEREOF, AND MEASURING METHOD THEREOF

TECHNICAL FIELD

The present invention disclosed in the present specification relates to a semiconductor device provided over a substrate having flexibility, a manufacturing method thereof, and a measuring method thereof. Specifically, the invention relates to a TEG which performs a test of a wireless chip, such as a characteristic evaluation or a defect analysis.

BACKGROUND ART

Recently, a wireless chip which sends and receives data has been actively developed, and such a wireless chip is also called an IC tag, an ID tag, a radio frequency (RF) tag, a radio frequency identification (RFID) tag, a wireless tag, an electronic tag, a wireless processor, a wireless memory, or the like.

As a transmission system of the wireless chip, there are three types of an electromagnetic coupling system, an electromagnetic induction system, and a radio wave system. The electromagnetic coupling system employs a mutual induction of electric coils by alternating magnetic field, and employs a frequency of 13.56 MHz. With the electromagnetic coupling system, a communication with a range of approximately several tens cm at most can be performed. The electromagnetic induction system employs two types of frequencies with classifying broadly. One is 135 kHz or less, and the other is 13.56 MHz. Communication with a range of maximum about 1 m with a wireless chip can be performed, though it depends on a shape and a size of a wireless chip and a reader/writer. The radio wave system employs frequency bands of UHF and 2.45 GHz, and has a greatest feature that a communication range is long.

Generally, a wireless chip (also referred to as an IC chip) includes an integrated circuit portion including a transistor or the like, and an antenna. The wireless chip can exchange information with an external device (reader/writer) via radio waves. Lately, by providing the wireless chip to various articles, monitoring, management, or the like of the articles is tried. For example, a merchandize management system has been proposed in which by attaching a wireless chip to an article, the merchandise management is automatically carried out with ease, as well as the stock control of the stock quantity, the stock status, and the like (Reference 1: Japanese Patent Laid-Open No. 2004-359363). In addition, an application of the wireless chip to a security device or a security system has been proposed for improving the anticrime effect (Reference 2: Japanese Patent Laid-Open No. 2003-303379). Further, a method for preventing abuse due to exploitation by mounting the wireless chip to paper money, securities, or the like has been proposed (Reference 3: Japanese Patent Laid-Open No. 2001-260580). Thus, applications of the wireless chip to various fields have been proposed.

In addition, the wireless chip is used by attaching to a surface of an article, embedding in an article, or the like so as to be fixed. For example, the wireless chip is used after embedding in an organic resin of a package made of the organic resin, or attaching to a surface thereof.

DISCLOSURE OF INVENTION

In a manufacturing process of a wireless chip, the wireless chip is not formed separately from other wireless chips, and several tens to several hundreds of wireless chips are simultaneously manufactured over one wafer, and then, divided into each chip. In this manufacturing process, when the plurality of wireless chips is simultaneously manufactured, a test element called a TEG (Test Element Group) is manufactured in some cases. The TEG is used to measure yield of the completed wireless chip and to measure electric characteristics of an element of an integrated circuit included in the wireless chip when a problem in performance of the wireless chip occurs. There are some types of TEGs, which are a TEG for evaluating an integrated circuit on the whole, a TEG for evaluating only a single transistor or resistance, or the like.

A method for measuring electric characteristics of the TEG is roughly divided into two types, which are a contact type and a contactless type. The contact-type test method has been preferably used, since it is more precisely carried out comparing with the case of the contactless type and a test device is simple.

As the contact-type test method, a method has been known, which uses an apparatus (prober) in which a needle called a probe contacts an electrode pad formed over a surface of the TEG, while observing with a scanning electron microscope or the like, to measure electric contact with a specific portion of a semiconductor element. However, this method is for a case of measuring a TEG manufactured over a single crystal silicon substrate (wafer). In a case of measuring a TEG manufactured over a flexible substrate, this method is difficult to be used. In other words, since the flexible substrate is very soft, there is a problem in pricking the TEG manufactured over a flexible substrate when the probe contacts. In addition, a wireless chip manufactured over a flexible substrate is required to have characteristics of being able to be used when the chip is bent or pulled. Accordingly, a bending property and a pulling property of the wireless chip are required to be measured with the TEG; however, such properties are difficult to be measured with the method using a probe. In addition, there is a problem in that an electrode pad itself is deformed by repeating the tests such as the characteristic evaluation and the defect analysis, and accordingly, repeating measurements becomes hard. Further, since the wireless chip is extremely small, a sophisticated technique in treating or measuring is demanded. Therefore, it has been actually difficult to measure characteristics of a wireless chip manufactured over a flexible substrate with the contact-type test method.

It is an object of the invention to provide a technique concerning a semiconductor device, a manufacturing method thereof, and a measuring method thereof, which is provided over a substrate having flexibility and can be easily subjected to a physical test (electric test) without deteriorating characteristics of an element.

One feature of the invention of a semiconductor device disclosed in this specification is to include a test element sealed with first and second films having flexibility; and a terminal portion included in the test element, in which the terminal portion is electrically connected to a wiring substrate having flexibility, via an anisotropic conductor provided in a contact hole over the terminal portion.

One feature of the invention of a semiconductor device disclosed in this specification is to include a test element sealed with first and second films having flexibility; in which the test element includes a contaminant prevention film, an element layer over the contaminant prevention film, and a layer for securing strength of the element layer formed over the element layer, a terminal portion is provided in the element layer, and the terminal portion is electrically connected to a wiring substrate having flexibility via an anisotropic conductor provided in a contact hole over the terminal portion.

In the above-described feature of the invention, the contaminant prevention film is formed by using silicon oxide, silicon nitride, silicon oxynitride, or silicon nitride oxide.

In addition, in the above-described feature of the invention, an organic material or an inorganic material is used for the layer for securing strength of the element layer.

In addition, in the above-described feature of the invention, the anisotropic conductor is an anisotropic conductive paste or an anisotropic conductive film.

One feature of the invention of a manufacturing method of a semiconductor device disclosed in this specification is to include the steps of forming a peeling layer over a substrate; forming an element layer provided with a test element including a terminal portion, over the peeling layer; separating the element layer from the substrate, after selectively removing the peeling layer and the element layer to form an opening portion; sealing the element layer with first and second films having flexibility; removing the first film formed over the terminal portion to form a contact hole reaching the terminal portion; filling the contact hole with a resin containing a conductive material; and heating after arranging a wiring substrate having flexibility over the resin with which filling has been performed, so that the terminal portion and the wiring substrate having flexibility are electrically connected via the resin containing a conductive material.

One feature of the invention of a manufacturing method of a semiconductor device disclosed in this specification is to include the steps of forming a peeling layer over a substrate; forming an element layer provided with a test element including a terminal portion, over the peeling layer; separating the element layer from the substrate, after selectively removing the peeling layer and the element layer to form an opening portion; sealing the element layer with first and second films having flexibility; removing the first film formed over the terminal portion to expose the terminal portion; and electrically connecting the exposed terminal portion and a wiring substrate having flexibility by using an anisotropic conductive film.

In the above-described feature of the invention, the first film formed over the terminal portion is removed by laser irradiation.

One feature of the invention of a manufacturing method of a semiconductor device disclosed in this specification is to include the steps of forming a base film over a substrate; forming a peeling layer over the base film; forming a contaminant prevention film over the peeling layer; forming an element layer provided with a test element including a thin film transistor and a terminal portion, over the contaminant prevention film; forming a layer for securing strength of the element layer, over the element layer; separating the contaminant prevention film, the element layer, and the layer for securing strength of the element layer from the substrate, after selectively removing the peeling layer, the contaminant prevention film, the element layer, and the layer for securing strength of the element layer and forming an opening portion; sealing the contaminant prevention film, the element layer, and the layer for securing strength of the element layer with first and second films having flexibility; removing the first film and the layer for securing strength of the element layer over the terminal portion to form a contact hole reaching the terminal portion; filling the contact hole with a resin containing a conductive material; and heating after arranging a wiring substrate having flexibility over the resin with which filling has been performed so that the terminal portion and the wiring substrate having flexibility are electrically connected via the resin containing a conductive material.

One feature of the invention of a manufacturing method of a semiconductor device disclosed in this specification is to include the steps of forming a base film over a substrate; forming a peeling layer over the base film; forming a contaminant prevention film over the peeling layer; forming an element layer provided with a test element including a thin film transistor and a terminal portion, over the contaminant prevention film; forming a layer for securing strength of the element layer, over the element layer; separating the contaminant prevention film, the element layer, and the layer for securing strength of the element layer from the substrate, after selectively removing the peeling layer, the contaminant prevention film, the element layer, and the layer for securing strength of the element layer, and forming an opening portion; sealing the contaminant prevention film, the element layer, and the layer for securing strength of the element layer with first and second films having flexibility; removing the first film and the layer for securing strength of the element layer over the terminal portion to expose the terminal portion; and electrically connecting the exposed terminal portion and a wiring substrate having flexibility by using an anisotropic conductive film.

In addition, in the above-described feature of the invention, the first film and the layer for securing strength of the element layer formed over the terminal portion are removed by laser irradiation.

In addition, in the above-described feature of the invention, silicon oxide, silicon nitride, silicon oxynitride, or silicon nitride oxide is used for the base film.

In addition, in the above-described feature of the invention, an organic material or an inorganic material is used for the layer for securing strength of the element layer.

In addition, in the above-described feature of the invention, a metal film containing tungsten, molybdenum, niobium, titanium, or silicon is used as the peeling layer.

One feature of the invention of a measuring method of a semiconductor device disclosed in this specification is a measuring method of a semiconductor device in which an element layer provided with a test element including a terminal portion is sealed with first and second films having flexibility, and is to include the steps of removing the first film formed over the terminal portion to form a contact hole reaching the terminal portion; filling the contact hole with a resin containing a conductive material; heating after arranging a wiring substrate having flexibility over the resin with which filling has been performed so that the terminal portion and the wiring substrate having flexibility are electrically connected via the resin containing a conductive material; and carrying out a measurement.

One feature of the invention of a measuring method of a semiconductor device disclosed in this specification is a measuring method of a semiconductor device in which an element layer provided with a test element including a terminal portion is sealed with first and second films having flexibility, and is to include the steps of removing the first film formed over the terminal portion to expose the terminal portion; electrically connecting the exposed terminal portion and a wiring substrate having flexibility using an anisotropic conductive film; and carrying out a measurement.

In addition, in the above-described feature of the invention, after carrying out the measurement with the terminal portion and the wiring substrate having flexibility connected electrically, only the terminal portion of the test element is removed and the element layer is sealed with third and fourth films.

In addition, in the above-described feature of the invention, after carrying out the measurement with the terminal portion and the wiring substrate having flexibility connected electrically, the wiring substrate having flexibility is separated and the element layer is sealed with third and fourth films.

In addition, in the above-described feature of the invention, as one example of the wiring substrate having flexibility, there is a flexible printed circuit (FPC). The FPC refers to a substrate in which a conductive wiring is formed over an insulating film having flexibility of polyester, polyimide, or the like, with a printed wiring technique.

In addition, in this specification, a chip for a TEG having a new feature of the invention, a wireless chip manufactured by using the chip for a TEG, or the like is called a semiconductor device. In addition, the chip for a TEG is provided with a TEG, namely a test element. The semiconductor device means all devices which utilize semiconductor characteristics.

In a semiconductor device of the invention, a TEG which is sealed with first and second films having flexibility includes a terminal portion, and the terminal portion is connected to a wiring substrate having flexibility. Therefore, even in the TEG having flexibility, a contact-type test method can be used. Further, since an electrode pad is not used, deformation of the electrode pad does not occur and damages to the TEG are not generated due to repeated measurements. In addition, since the terminal portion is not always exposed to a peripheral atmosphere, little deterioration occurs even when stored for a long time. In addition, since a measurement can be carried out with a wiring substrate having flexibility attached, the change with time in electric characteristics of a semiconductor device having flexibility when the semiconductor device is bent or pulled can be measured as needed.

After a TEG including a terminal portion is manufactured, electric characteristics or the like are measured. In the TEG which has passed this characteristic test, the element layer is again sealed after cutting the terminal portion. Alternatively, the element layer is again sealed with a film after separating the wiring substrate having flexibility. Accordingly, the TEG can be used as a wireless chip.

BRIEF DESCRIPTION OF DRAWINGS

In accompanying drawings.

BEST MODE FOR CARRYING OUT THE INVENTION

Embodiment Mode

Figure 1A:
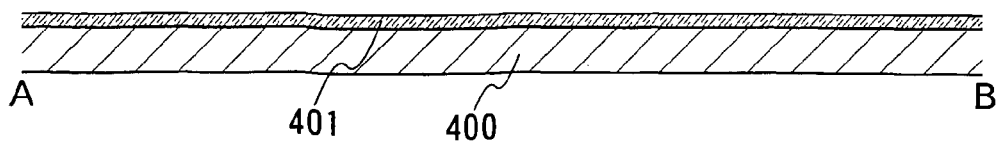
FIGS. 1A to 1E explain Embodiment 1.

Embodiment modes and Embodiments of the invention will be described in detail with reference to the drawings. However, it is easily understood by those skilled in the art that the invention is not limited by the following descriptions and various changes may be made in forms and details without departing from the spirit and the scope of the invention. Therefore, the invention should not be limited to descriptions of the embodiment modes and embodiments below. The same reference numerals are commonly given to the same components or components having the same function in the structure of the invention.

Embodiment Mode 1

In Embodiment Mode 1, an example of a process will be explained, in which a chip for a TEG is manufactured at the same time as a plurality of wireless chips is manufactured over a flexible substrate.

First, a peeling layer 401 is formed over a substrate 400 shown in FIG. 1A. Since the substrate used here is removed in a later step, it is not limited to a flexible substrate, and a glass substrate, a quartz substrate, a ceramic substrate, or the like can be used. Further, a metal substrate including stainless steel or a semiconductor substrate on which an insulating film is formed may be used.

Figure 1B:
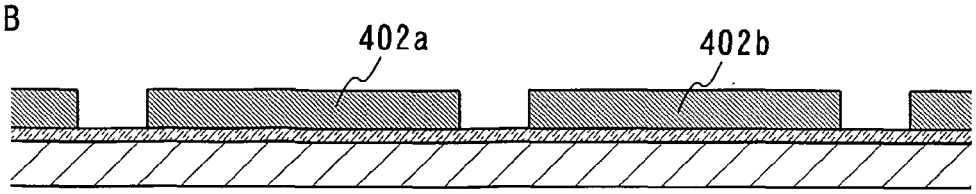
Figure 1C:
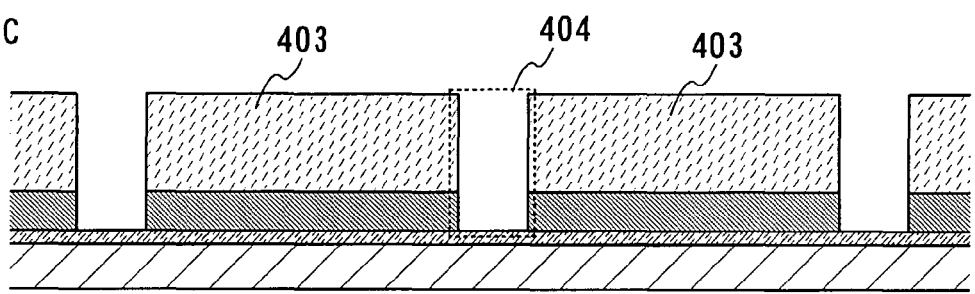
Figure 1D:
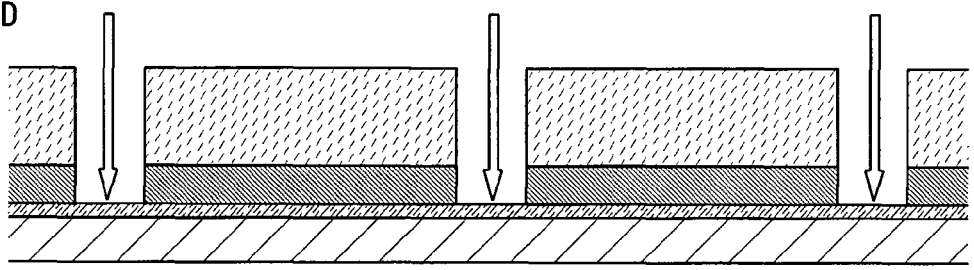
Figure 1E:
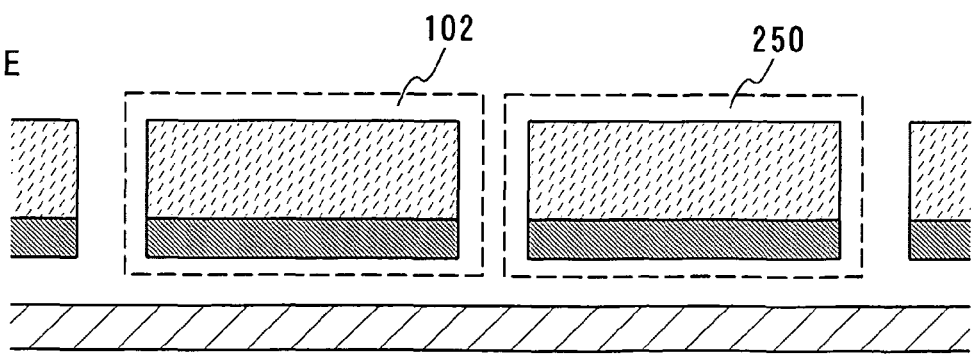

Next, over the peeling layer 401, an element layer 402a which is a part of an element 102 to be a wireless chip shown in FIG. 1E is formed, while an element layer 402b which is a part of an element 250 to be a chip for a TEG shown in FIG. 1E is formed (see FIG. 1B). The element 102 to be a wireless chip mainly includes a thin film circuit having a transistor or the like, and an antenna. The element 250 to be a chip for a TEG includes a thin film circuit and a terminal portion. In this specification, the thin film circuit means a circuit in which a thin film transistor having a semiconductor film of 1 μm thickness or less, an active element such as a diode, or a passive element such as a resistor is formed. In the element 102 to be a wireless chip and the element 250 to be a chip for a TEG, a circuit portion including not only a single element but also a circuit (for example, a memory circuit (hereinafter also referred to as a "memory"), a control circuit, a sensor, or the like) including a plurality of elements such as transistors is collectively called a thin film circuit portion.

Subsequently, a layer (hereinafter referred to as a strength securing layer) 403 for securing strength of the element layers 402a and 402b are formed over the element layers 402a and 402b. There is a risk that the element layers 402a and 402b are warped due to compressive stress or pulling strength in separating the element layers 402a and 402b from the substrate 400, and that the thin film transistors or the like included in the element layers 402a and 402b may be destroyed. In specific, the thinner the element layer 402 is formed, the more the fear of warping the element layer 402 is increased. As described in this embodiment mode, the warping of the element layer 402 after peeling can be prevented by forming the strength securing layer 403 over the element layers 402a and 402b in advance, before peeling the element layers 402a and 402b from the substrate 400.

Note that, since the strength securing layer 403 is formed only on the element layers 402a and 402b in FIGS. 1A to 1E, an opening portion 404 which separates the element layers 402a and 402b is formed when the strength securing layer 403 is formed.

As a structure of the thin film circuit portion of the element 250 to be a chip for a TEG, the same structure of the thin film circuit portion included in the element 102 to be a wireless chip may be used, or the same structure of a portion of a circuit included in the thin film circuit portion of the element 102 to be a wireless chip may be used. In addition, as well as providing the same circuit of the thin film circuit portion of the element 102 to be a wireless chip, it is preferable that a plurality of single transistors is provided so as to measure characteristics of the single transistors formed over a flexible substrate.

Then, the peeling layer 401 is removed by introducing an etching agent to the opening portion 404. The peeling layer 401 may be completely removed, or may be removed so as to partially remain (see FIGS. 1C, 1D, and 1E). Other than the method of removing the peeling layer 401 by introducing the etching agent, a method of removing the peeling layer 401 provided below the opening portion 404 by irradiation of laser light (for example, UV light) can be used.

Figure 6A:
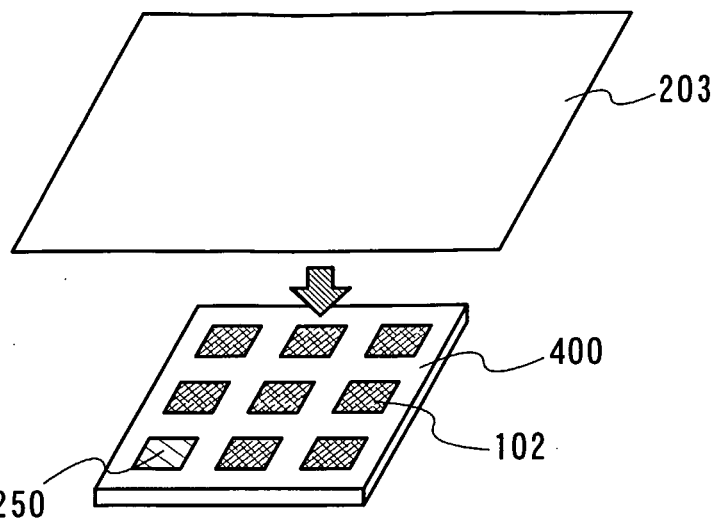
FIGS. 6A to 6C explain Embodiment 1.
Figure 6B:
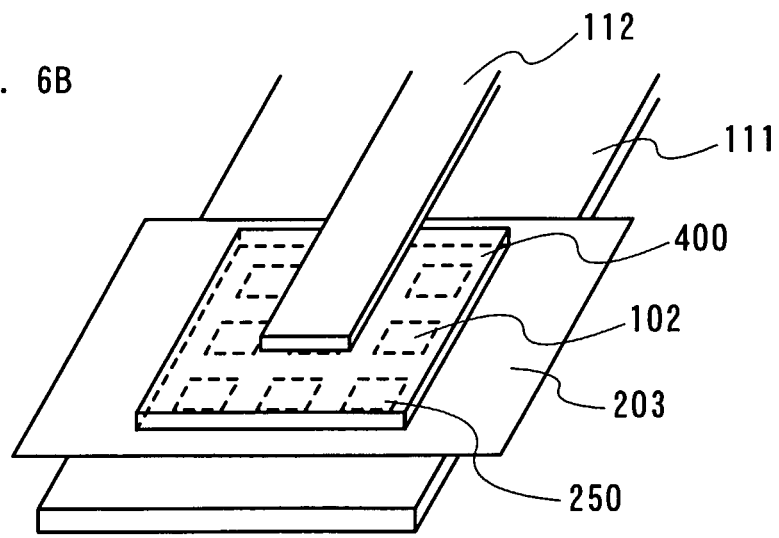

Next, as shown in FIG. 6A, a first film 203 is arranged over the element 102 to be a wireless chip and the element 250 to be a chip for a TEG. Next, as shown in FIG. 6B, a lower surface of the substrate 400 and an upper surface of the first film 203 are interposed between arms 111 and 112. Then, keeping this state, the substrate 400 is turned over by 180 degrees to invert an upper surface and the lower surface of the substrate 400. By removing the substrate 400, a state is made in which the element 102 to be a wireless chip and the element 250 to be a chip for a TEG are regularly arranged over the first film 203 (see FIG. 6C).

Figure 7A:
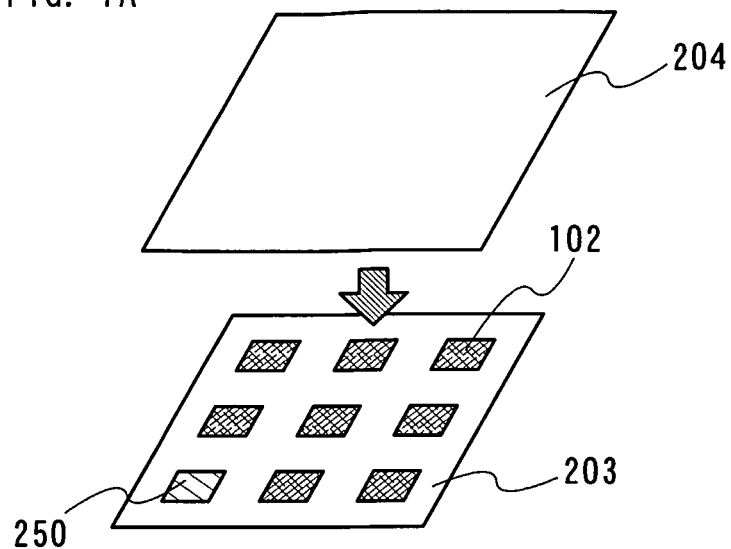
FIGS. 7A to 7C explain Embodiment Mode 1.

Then, as shown in FIG. 7A, a second film 204 is arranged over the first film 203 on which the element 102 to be a wireless chip and the element 250 to be a chip for a TEG are formed.

Note that the first and the second films may be formed by using a thermoplastic resin, preferably formed by using a material having a low softening point. For example, a polyolefin-based resin such as polyethylene, polypropylene, or polymethylpentene; a vinyl-based copolymer such as vinyl chloride, vinyl acetate, vinyl chloride-vinyl acetate copolymer, ethylene-vinyl acetate copolymer, vinylidene chloride, polyvinyl butyral, or polyvinyl alcohol; an acrylic-based resin; a polyester-based resin; a urethane-based resin; a cellulosic-based resin such as cellulose, cellulose acetate, cellulose acetate butyrate, cellulose acetate propionate, or ethyl cellulose; a styrene-based resin such as polystyrene or acrylonitrile-styrene copolymer; or the like can be given. A film having a single layer or a plurality of layers of the thermoplastic resin as described above may be used as the first and the second films. The film with a plurality of layers has, for example, a structure in which, over a base including a first thermoplastic resin, an attachment layer including a second thermoplastic resin having a lower softening point than that of the first thermoplastic resin is formed. A structure having two or more layers may be employed as well. In addition, a biodegradable thermoplastic resin may be used. The first and the second films formed by using these materials have flexibility.

Furthermore, in order to suppress an adverse effect to a semiconductor element due to external static electricity, a film to which an antistatic treatment is provided (hereinafter referred to as an "antistatic film") can be used as well, as the first and the second films. As the antistatic film, a film in which an antistatic material is dispersed in the resin, a film to which an antistatic material is attached, or the like can be given. The film provided with the antistatic material may be a film in which only one side is provided with the antistatic material, or may be a film in which both sides are provided with the antistatic material. The film in which only one side is provided with the antistatic material may have a structure in which the side provided with the antistatic material is attached so as to be inside of the film or outside of the film. Note that the antistatic material is preferably formed over an entire surface of the film; however, it may be formed to a part of the film.

As the antistatic material, metal, oxide of indium and tin (hereinafter referred to as "ITO"), a surfactant such as an ampholytic surfactant, a cationic surfactant, or a nonionic surfactant can be used. In addition, a resin material or the like, containing a cross-linking copolymer having a carboxyl group and a quaternary ammonium base in side chains, can also be used as the antistatic material. By attaching, kneading, or applying these materials to the film, an antistatic film can be formed.

Figure 7B:
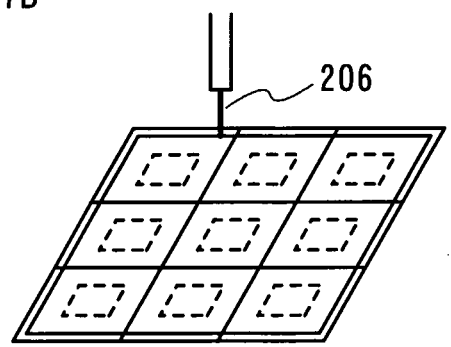
Figure 7C:
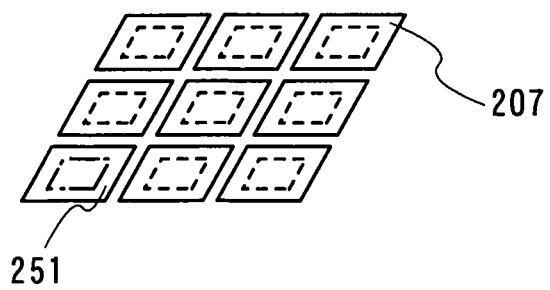

Subsequently, as shown in FIG. 7B, the first film 203 and the second film 204 are melted by irradiating peripheries of the element 102 to be a wireless chip and the element 250 to be a chip for a TEG; with laser light 206 from above the second film 204. Then, sealing and cutting are performed at the same time. In this case, since the sealing and cutting are performed at the same time, a process can be simplified and throughput can be improved. A state after the sealing and cutting is shown in FIG. 7C. Sealing and cutting are performed by the above-explained method to complete a wireless chip 207.

Figure 8:
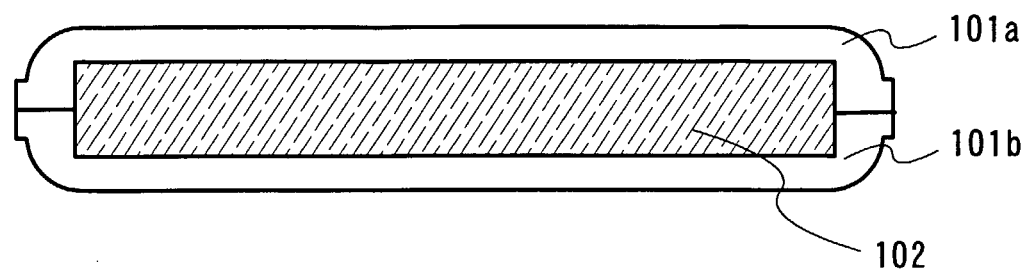
FIG. 8 explains Embodiment Mode 1.

An example of a cross-section of the wireless chip 207 is shown in FIG. 8. In the wireless chip 207, an element layer 102 including a thin film circuit portion and an antenna is sealed with a first film 101a and a second film 101b having flexibility. Accordingly, the wireless chip 207 can be attached even to an article having a curving surface.

Note that described with reference to FIGS. 7A, 7B, and 7C is the method in which sealing and cutting are performed by melting the peripheries of the element 102 to be a wireless chip and the element 250 to be a chip for a TEG; with laser light. However, the sealing and cutting may be performed by melting the first and the second films at the peripheries of the element 102 to be a wireless chip and the element 250 to be a chip for a TEG, by a heating method other than using the laser light.

Figure 9:
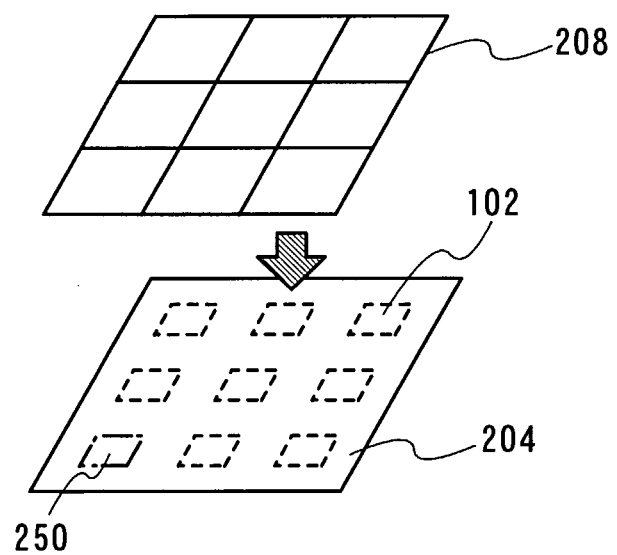
FIG. 9 explains Embodiment Mode 1.

For example, as shown in FIG. 9, a heated wire 208 may be pressed to the second film 204, thereby the first and the second films at the peripheries of the element 102 to be a wireless chip and the element 250 to be a chip for a TEG are melted to perform sealing and cutting.

Figure 10A:
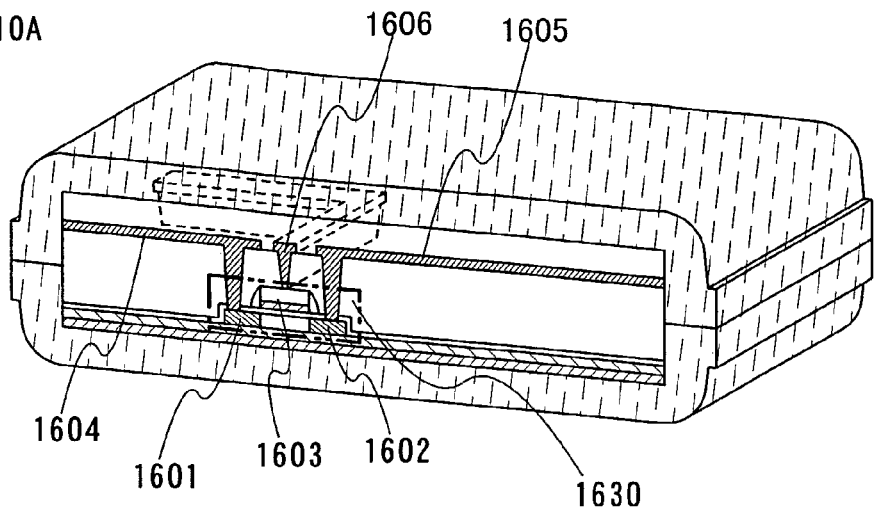
FIGS. 10A to 10C explain Embodiment Mode 1.

Next, a chip 251 for a TEG after sealing and cutting will be described. An example of a perspective view in which a cross-section of the chip 251 for a TEG is taken, is shown in FIG. 10A. A hithermost element in the drawing is a thin film transistor 1630, reference numerals 1601 and 1602 denote a source or a drain of the thin film transistor 1630, and 1603 denotes a gate. Reference numerals 1604, 1605, and 1606 denote wirings connected to the source, the drain, and the gate of the thin film transistor 1630, respectively. Each wiring is pulled (extended) to a terminal portion 1621 or a terminal portion 1622. Note that in this embodiment mode, the gate 1603 of the thin film transistor 1630 has a two-layered structure; however, the invention is not limited to this structure and a single-layer structure may be used.

In FIG. 10A, only a single thin film transistor 1630 is shown. However, there exists a plurality of the chips 251 for TEGs. As for an element whose electric characteristics are to be measured, a wiring connected to the element is pulled (extended) to the terminal portion 1621 or 1622. In other words, not only the wirings connecting to the source, drain, and the gate of the thin film transistor 1630 but also the wiring connected to the element whose electric characteristics are to be measured, is pulled (extended) to the terminal portion 1621 or 1622. In addition, in this embodiment mode, a structure of providing two terminal portions is described. However, the invention is not limited to this, and one terminal portion or three or more terminal portions may be provided. Further, there is no limitation on a size of the terminal portion such as the number of wirings, a wiring width, or a width between the wirings.

In addition, in this embodiment mode, described is the case where one chip for a TEG is formed as a chip after sealing and cutting. However, a plurality of chips for TEGs may be formed as well. There is no limitation on an element structure of the chip for a TEG.

Figure 10B:
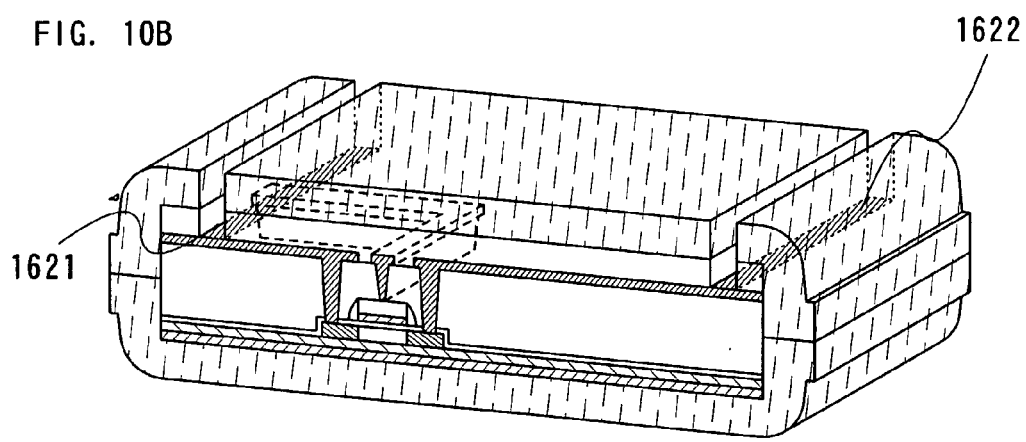

First, areas including the terminal portions 1621 and 1622 of the chip 251 for a TEG are irradiated with laser light (for example, UV light or $CO_2$ laser light). Accordingly, opening portions (contact holes) reaching the terminal portions 1621 and 1622, which are provided inside the chip for a TEG, are formed (FIG. 10B).

Figure 10C:
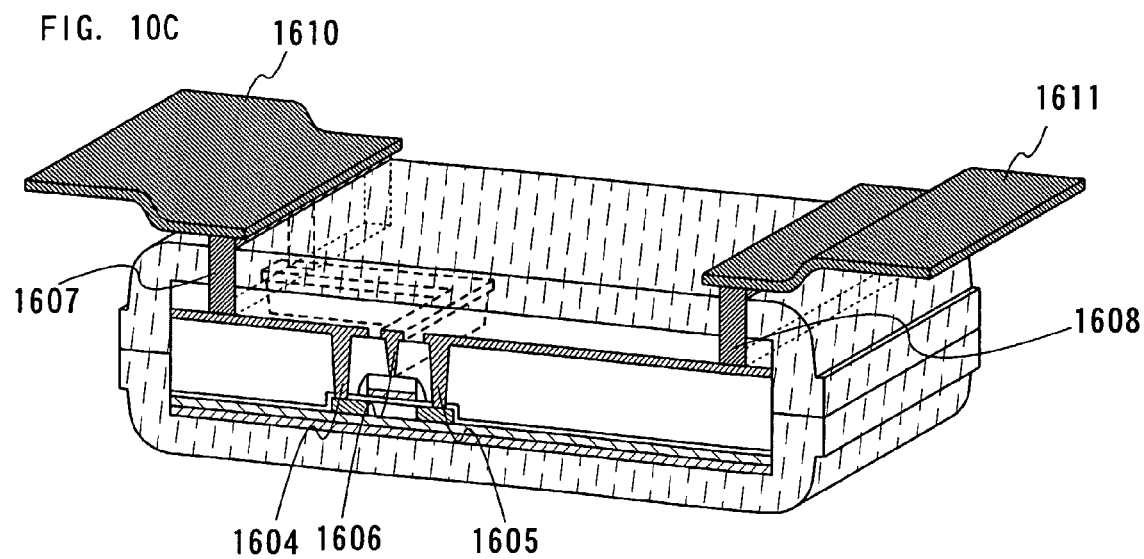

Then, the terminal portions 1621 and 1622 are electrically connected to wiring substrate 1610 and 1611 having flexibility respectively, through the opening portions (contact holes) by using a conductive material. Accordingly, the chip 251 for a TEG is completed (FIG. 10C). Specifically, such a method may be used that, after dropping an anisotropic conductive paste to the opening portions (contact holes) in advance, the wiring substrate 1610 and 1611 having flexibility are attached to the terminal portions 1621 and 1622, respectively or that, after an anisotropic conductive film or an anisotropic conductive paste is attached temporary to the wiring substrate 1610 and 1611 having flexibility in advance, the wiring substrate 1610 and 1611 having flexibility are connected to the terminal portions 1621 and 1622 with pressure bonding. Reference numerals 1607 and 1608 denote conductors formed using a conductive material. In this specification, the anisotropic conductive film means a thermosetting or thermoplastic resin film in which conductive particles are mixed, and it is also referred to as an ACF (Anisotropic Conductive Film). A two-layered ACF in which two anisotropic conductive films are stacked or a three-layered ACF in which three anisotropic conductive films are stacked may be used. Since the wirings (wirings connected to the terminal portions 1621 and 1622) are protected by the strength securing layer, generation of a crack due to a pressure deformation can be prevented.

As described above, since a terminal portion of the chip 251 for a TEG is electrically connected to the wiring substrate having flexibility, electric characteristics can be easily measured also in the chip 251 for a TEG having flexibility. In addition, the wireless chip is not damaged by the measurement. In addition, since the terminal portion is not always exposed to a peripheral atmosphere, there are few cases of deterioration even when it is stored for a long time. In addition, since the measurement is performed with the FPC attached, a change with time in the electric characteristics when the chip 251 for a TEG is bent or pulled, can be measured as needed.

Note that, in this embodiment mode, the chip 251 for a TEG provided with a terminal portion is described; however, a plurality of wireless chips may be each provided with a terminal portion. When the wireless chip is provided with the terminal portion, a spot inspection of the wireless chip before shipment can be easily carried out. Each wireless chip may have one terminal portion or more.

Embodiment Mode 2

In Embodiment Mode 2, a chip for a TEG is manufactured at the same time as a plurality of wireless chips is manufactured over a flexible substrate, and an example of how a result of a characteristic evaluation or a defect analysis on the chip for a TEG is reflected, will be described.

In a case of obtaining an anticipated characteristic result by the characteristic evaluation or the defect analysis on the chip for a TEG, the wireless chips manufactured at the same time as the chip for a TEG is manufactured, can be shipped, as it is, as products. In this case also, after cutting a terminal portion of the chip for a TEG, an element layer is again sealed. Alternatively, after separating a wiring substrate having flexibility, an element layer is again sealed with a film. Accordingly, the chip manufactured as a chip for a TEG can be used as a wireless chip, and yield can be improved.

In a case where an anticipated response result cannot be obtained by the characteristic evaluation or the defect analysis on the chip for a TEG, it is analyzed that which level a problem is generated in. For example, in a case where a single element such as a transistor has a problem in electric characteristics, a manufacturing process itself of the single element may be reviewed, and points of improvement may be reflected in the next manufacturing process of a wireless chip. In addition, in a case where predetermined characteristics cannot be obtained by a physical test such as a bending test or a pull test on the chip for a TEG having flexibility, a manufacturing process itself of a single element may be reviewed, and points of improvement may be reflected in the next manufacturing process of a wireless chip. Further, when there is no problem of electric characteristics as a single element but is a problem of characteristics as a circuit such as a rectifying circuit or a demodulating circuit, a relation of connection between elements which form each circuit may be reviewed, and points of improvement may be reflected in the next manufacturing process of a wireless chip.

Embodiment 1

In Embodiment 1, a process up to forming a plurality of wireless chips and a chip for a TEG as explained in Embodiment Mode 1, will be described in more detail.

First, a substrate 400 is prepared and a peeling layer 401 is formed over the substrate 400 as shown in FIG. 1A. Specifically, a glass substrate such as barium borosilicate glass, or aluminoborosilicate glass, a quartz substrate, a ceramic substrate, or the like can be used as the substrate 400. Further, a metal substrate such as stainless steel or a semiconductor substrate provided with an insulating film on its surface may also be used. In addition, although a flexible substrate made from a synthetic resin such as plastic generally tends to have lower heat-resistance than that of the above-described substrate material, it can also be used as long as it can withstand a process temperature in the manufacturing process. The surface of the substrate 400 may be planarized by polishing using a CMP method or the like.

The peeling layer 401 is formed using a metal film containing tungsten (W), molybdenum (Mo), niobium (Nb), titanium (Ti), silicon (Si), or the like. In this embodiment, a metal film containing W is used as the peeling layer 401. The metal film containing W can be formed by CVD, sputtering, electron beam, or the like. Here, the metal film containing W is formed by sputtering. In a case where the substrate is physically peeled in a subsequent step, a metal oxide (for example, $WO_x$) may be formed over the metal film (for example, W). Alternatively, as the combination of a metal film and a metal oxide film, $Mo/MoO_x$, $Nb/NbO_x$, $Ti/TiO_x$, or the like can be used. Further alternatively, only a metal oxide such as $WO_x$, $MoO_x$, $NbO_x$, or $TiO_x$ can be formed as the peeling layer 401.

In addition, it is preferred to provide, over the metal oxide film, a single-layer structure or a stack structure of an insulating film containing oxygen or nitrogen such as silicon oxide ($SiO_x$), silicone nitride ($SiN_x$), silicon oxynitride ($SiO_xN_y$) (x>y), or silicon nitride oxide ($SiN_xO_y$) (x>y) (x and y are positive integers), as a contaminant prevention film for preventing the enter of an impurity or a dust from the substrate 400 or the peeling layer 401 formed using a metal film. In this embodiment, silicon oxynitride ($SiO_xN_y$), silicon nitride oxide ($SiN_xO_y$), and silicon oxynitride ($SiO_xN_y$) are sequentially stacked to form the contaminant prevention film. Thus stacked insulating films can be continuously formed without being exposed to air.

Note that, the peeling layer 401 is formed directly on the substrate 400 in FIG. 1A; however, a base film may be formed between the substrate 400 and the peeling layer 401. The base film can have a single-layer structure of an insulating film containing oxygen or nitrogen such as silicon oxide ($SiO_x$), silicon nitride ($SiN_x$), silicon oxynitride ($SiO_xN_y$) (x>y), or silicon nitride oxide ($SiN_xO_y$) (x>y) (x and y are positive integers) or a stack structure thereof. The base film is preferably formed between the substrate 400 and the peeling layer 401 particularly when contamination from the substrate may occur.

Next, a plurality of integrated circuits (thin film circuits) including thin film transistors, and a layer 402 including a terminal portion (hereinafter referred to as element layers 402a and 402b) are formed over the peeling layer 401 (FIG. 1B). The number of terminal portions may be one, or a plurality of terminal portions may be formed in accordance with the purpose. For example, a structure including two terminal portions may be employed, in which a first terminal portion is formed by pulling (extending) a wiring for measuring electric characteristics or the like of a single thin film transistor and a second terminal portion is formed by pulling (extending) a wiring for measuring characteristics as a whole integrated circuit. The element layer 402a used as an element to be a wireless chip may have any structure; for example, an LSI, a CPU, a memory, or the like can be provided.

Note that a semiconductor film included in the element layers 402a and 402b has a thickness of 0.2 μm or less, typically 40 nm to 170 nm, and preferably 50 nm to 150 nm.

Figure 2A:
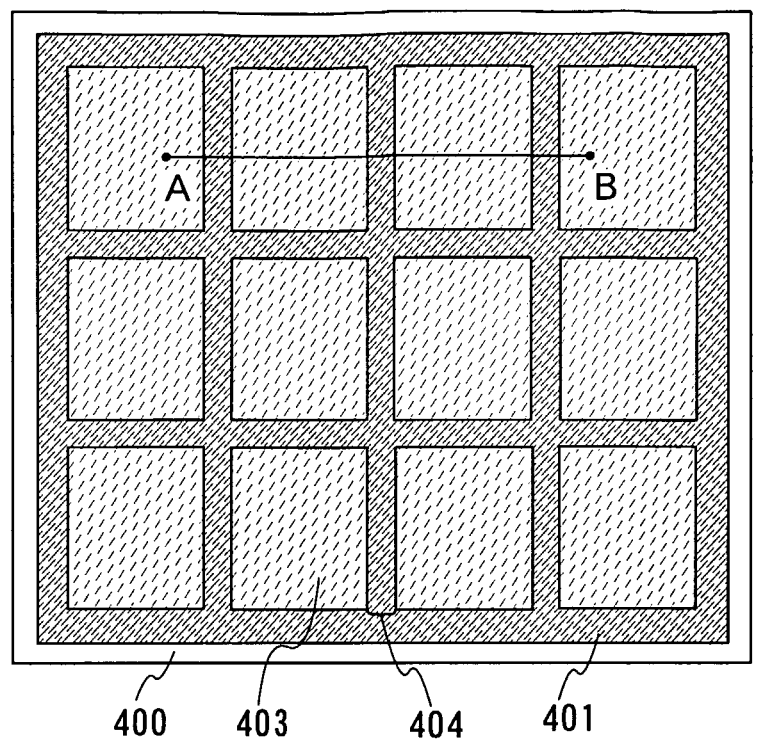
FIGS. 2A and 2B explain Embodiment 1.

Subsequently, a layer for securing strength (strength securing layer) 403 is formed over the element layers 402a and 402b (FIG. 1C). When the element layers 402a and 402b are peeled from the substrate 400, there is a risk that the element layer 402 may warp due to compressive stress, pulling strength, or the like to destroy the thin film transistor or the like included in the element layers 402a and 402b. The thinner the element layer 402 is formed, the more the possibility of warping the element layer 402 is increased. Therefore, by providing the strength securing layer to the element layer 402 for reinforcement in advance before the element layers 402a and 402b are peeled from the substrate 400, warping of the peeled element layer 402 can be prevented. Note that a top view in this state is shown in FIG. 2A. FIG. 2A shows the case of forming twelve thin film circuits to be chips over the substrate 400, and a cross-sectional view taken along line A-B in FIG. 2A corresponds to FIG. 1C.

The strength securing layer 403 is a layer formed by using a solid material such as an organic compound or an inorganic compound, and a resin material such as an epoxy resin, an acrylic resin, a phenol resin, a novolac resin, a melamine resin, a urethane resin, a silicone resin, or a siloxane-based resin can be used. Alternatively, an organic material such as benzocyclobutene, parylene, fluorinated-arylene-ether, polyimide, or a photosensitive resin, a compound material containing a water-soluble homopolymer and a water-soluble copolymer, an inorganic material such as silicon nitride, silicon oxide, or silicon oxynitride, or the like can be used. In addition, the strength securing layer 403 may be formed by stacking a plurality of types of materials selected from the materials described above. Note that the siloxane-based resin corresponds to a resin containing a Si—O—Si bond. Siloxane has a skeletal structure formed from a bond of silicon (Si) and oxygen (O). As a substituent, an organic group containing at least hydrogen (for example, an alkyl group or aromatic hydrocarbon) is used. As the substituent, a fluoro group may be used. In addition, an organic group containing at least hydrogen and a fluoro group may be also used as the substituent.

The strength securing layer 403 can be formed by a screen printing method or a droplet discharge method. The droplet discharge method is a method for selectively discharging (spraying) a droplet (also referred to as a dot) of a composition containing a material of a conductive film, an insulating film, or the like to form a film in an arbitrary position, which is also called an inkjet method depending on the system. An inorganic material may be used other than the resin material as long as it has a sufficient resistivity to an etching agent. As a method for forming the strength securing layer 403, there is a method in which a photosensitive resin is applied by a spin coating method or the like, exposed to light, and developed so that the photosensitive resin can remain in only a necessary part, in addition to the screen printing method and the droplet discharge method described above.

Although FIGS. 1A to 1E show the case where the strength securing layer 403 is formed only on an upper surface of the element layers 402a and 402b, the strength securing layer 403 may be formed to cover a side face of the element layers 402a and 402b in addition to the upper surface thereof. In this case, the strength securing layer 403 effectively functions as a protective layer for the element layers 402a and 402b, when the element layers 402a and 402b are peeled from the substrate 400. However, attention needs to be paid in this case so that the strength securing layer 403 does not cover an opening portion 404 for introducing an etching agent later.

Further, FIGS. 1A to 1E show the case for forming the strength securing layer 403 after patterning the element layers 402a and 402b; however, the invention is not limited to this method. For example, as shown in FIGS. 3A to 3D, there may be employed a method as well in which the strength securing layer 403 is formed over the element layers 402 and patterned, and the element layers 402 are etched with the patterned strength securing layer 403 as a mask. In this specification, "patterning" means to etch a film into a predetermined shape.

Then, the etching agent is introduced into the opening portion 404 to remove the peeling layer 401 as shown in FIG. 1D. In this embodiment, the peeling layer 401 is removed by chemical reaction thereof with the etching agent. As the etching agent, a gas or a liquid containing halogen fluoride (halogen compound) which easily reacts with the peeling layer 401 can be used. In this embodiment, a chlorine trifluoride ($ClF_3$) gas which reacts well with tungsten (W) used for the peeling layer 401 is used as the etching agent. Alternatively, a gas containing fluorine such as $CF_4$, $SF_6$, $NF_3$, or $F_2$; a mixed gas of a plurality of types thereof; or a strong alkali solution such as tetramethyl ammonium hydroxide (TMAH) may also be used, which may be appropriately selected by a practitioner. In addition, other than the peeling method for removing the peeling layer 401 by introducing the etching agent, a method can also be used, in which peeling is performed after removing a part of the peeling layer 401 which is provided below the opening portion 404 by irradiation of laser light (for example, UV light).

Figure 2B:
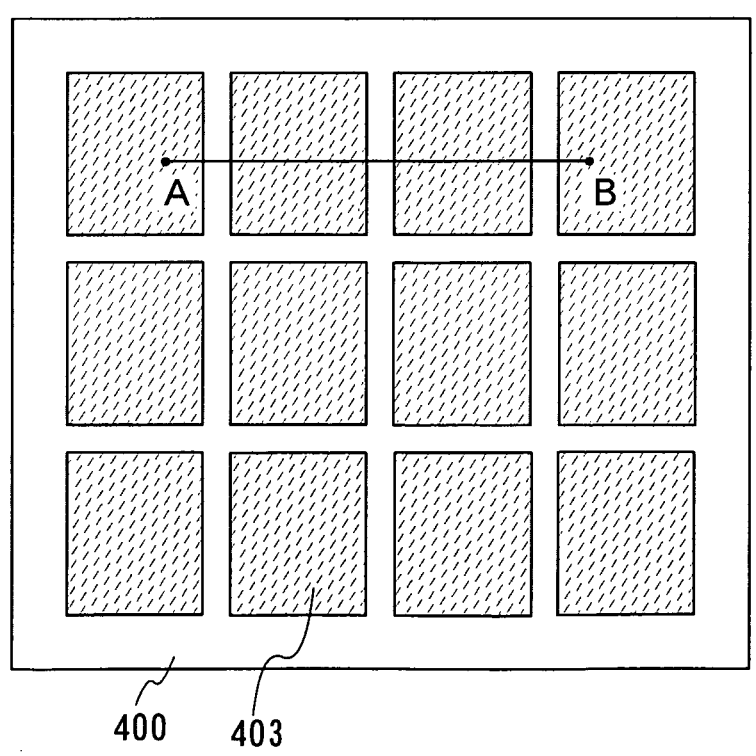
Figure 3A:
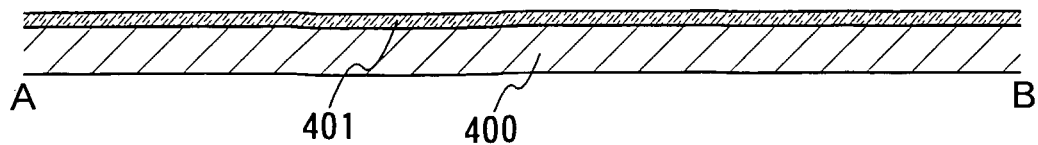
FIGS. 3A to 3D explain Embodiment 1.
Figure 3B:
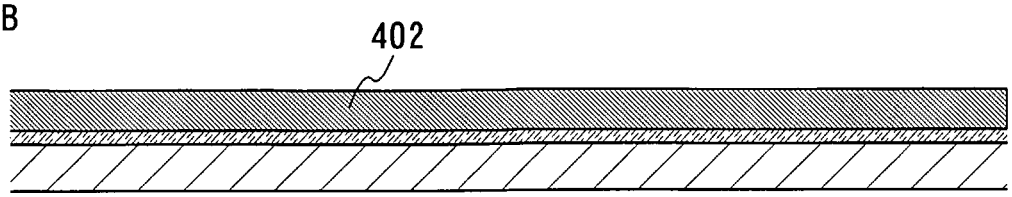
Figure 3C:
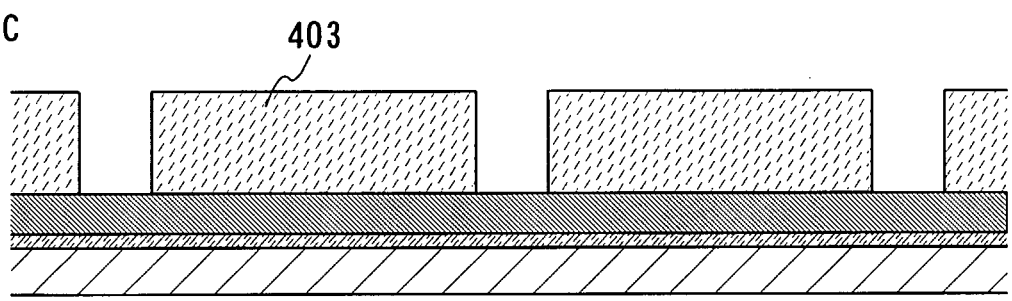
Figure 3D:
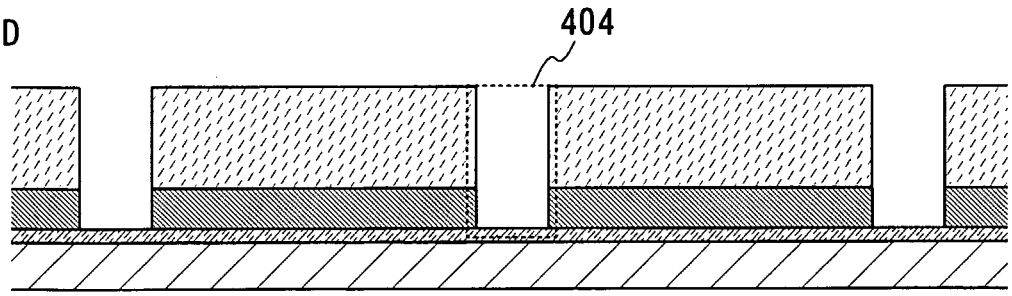

After removing the peeling layer 401, an element 102 to be a wireless chip and an element 250 to be a chip for a TEG including an element layer 402 and the strength securing layer 403 are separated (transferred) from the substrate 400. In order to completely remove the peeling layer 401 in this embodiment, the element 102 to be a wireless chip and the element 250 to be a chip for a TEG can be separated from the substrate 400 without using a physical means. A cross-section of this state is shown in FIG. 1E and a top view thereof is shown in FIG. 2B. A cross-sectional view taken along line A-B in FIG. 2B corresponds to FIG. 1E.

Figure 4A:
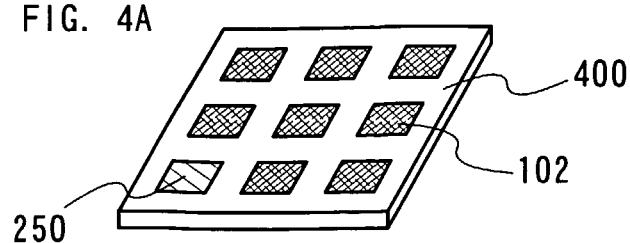
FIGS. 4A to 4C explain Embodiment 1.
Figure 4B:
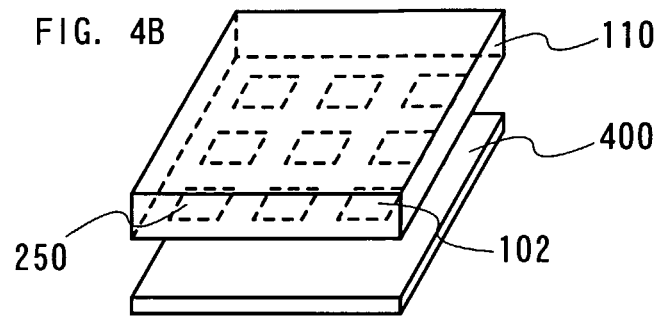
Figure 4C:
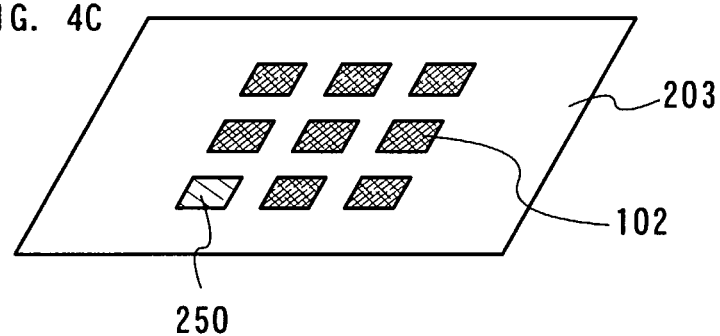

A perspective view after removing the peeling layer 401 is shown in FIG. 4A. Next, the element 102 to be a wireless chip and the element 250 to be a chip for a TEG over the substrate 400 are transferred onto a first film 203. Here, as shown in FIG. 4B, the element 102 to be a wireless chip and the element 250 to be a chip for a TEG which have been peeled from the substrate 400, are transferred with them held by an attachment means (vacuum chuck) 110, and arranged over the first film 203 (FIG. 4C).

Figure 5:
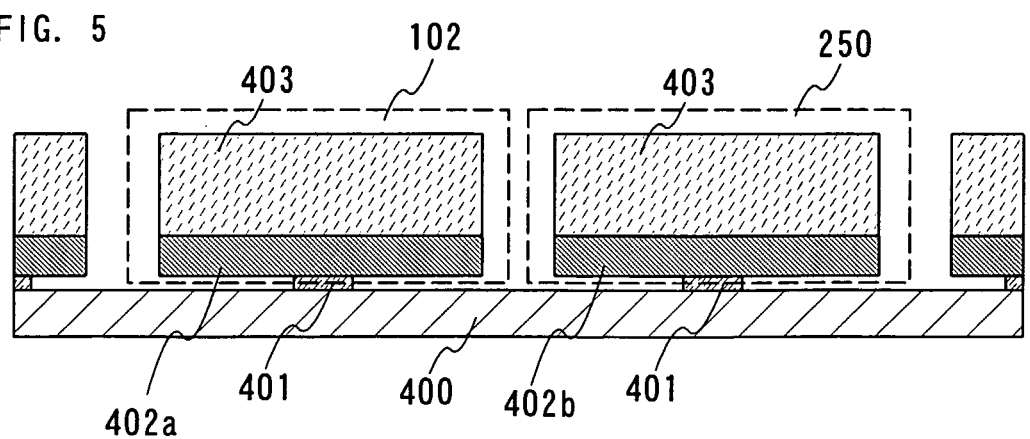
FIG. 5 explains Embodiment 1.

Note that here, the case where the peeling layer 401 is completely removed is described; however, the peeling layer 401 may be removed so as to partially remains as shown in FIG. 5. The element 102 to be a wireless chip and the element 250 to be a chip for a TEG are not separated from the substrate 400 until they are vacuumed up by the vacuum chuck 110, as a result of remaining a part of the peeling layer 401. Thus, the element 102 to be a wireless chip and the element 250 to be a chip for a TEG are not scattered.

In addition, as the method for transferring the element 102 to be a wireless chip and the element 250 to be a chip for a TEG over the substrate 400 onto the first film 203, a method other than the above-described method using the vacuum chuck 110 may be employed. For example, the method described in Embodiment Mode 1 can be used.

Figure 6C:
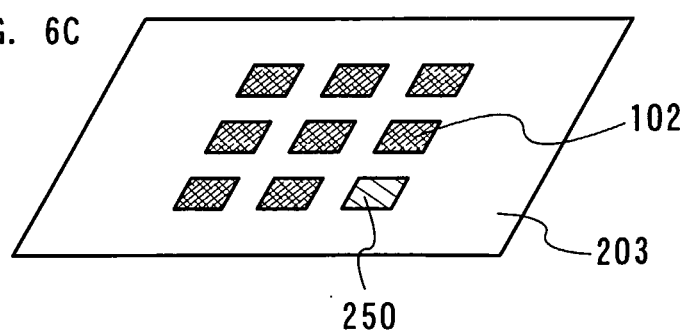

First, after completely removing the peeling layer 401, the first film 203 is arranged over a plurality of the elements 102 to be wireless chips and the element 250 to be a chip for a TEG which are arranged over the substrate 400 and have been detached from the substrate 400 (FIG. 6A). Next, the substrate 400 provided with the elements 102 to be wireless chips and the element 250 to be a chip for a TEG, and the first film 203 are sandwiched by arms 111 and 112 from the lower side of the substrate 400 and the upper side of the first film 203, and turned over by 180 degrees while keeping this state. Thus, a state shown in FIG. 6B is obtained. Then, a state in which the elements 102 to be wireless chips and the element 250 to be a chip for a TEG are regularly arranged over the first film 203 as shown in FIG. 6C can be obtained by removing the substrate 400.

Thereafter, sealing and cutting of the elements to be wireless chips and the element to be a chip for a TEG are performed in accordance with the process described in Embodiment Mode 1, thereby completing the wireless chips and the chip for a TEG of the invention.

Note that the peeled substrate 400 can be reused. Accordingly, a wireless chip can be manufactured at low cost. Therefore, even in the case of using a quartz substrate which is more expensive than a glass substrate, a wireless chip can be manufactured at low cost. Note that in the case of reusing a substrate, the peeling process is preferably controlled so as not to damage the substrate. However, if the substrate is damaged, a planarizing treatment may be performed thereto by forming an organic or inorganic resin film by a spin coating method or a droplet discharge method, or grinding or polishing the substrate, to be reused.

In the case of thus manufacturing a wireless chips or a chip for a TEG by forming a thin film circuit over a substrate having an insulating surface, there is no limitation on the shape of a mother substrate, compared with the case of taking chips out of a circular silicon wafer. Therefore, productivity of the wireless chips can be increased, and mass production can be performed. Moreover, cost can be reduced since the insulating substrate can be reused. This embodiment can be freely combined with the above-described embodiment modes.

Embodiment 2

Embodiment 2 describes a process up to a state in which the plurality of elements 102 to be wireless chips and the element 250 to be a chip for a TEG are arranged over the first film 203 shown in FIGS. 4C and 6C, which is different from the method in Embodiment 1.

Figure 11A:
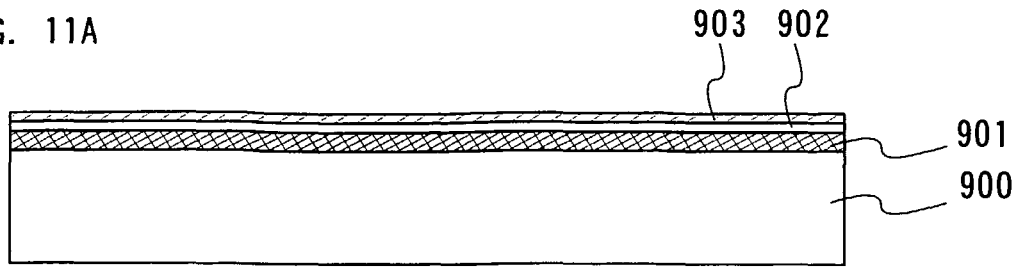
FIGS. 11A to 11D explain Embodiment 2.

First, a layer including a plurality of integrated circuits having thin film transistors (TFTs) and a terminal portion (hereinafter referred to as an "element layer 901"), is formed over one surface of a substrate 900 having an insulating surface (see FIG. 11A). Here, the number of the terminal portions may be one, or a plurality of the terminal portions may be formed in accordance with the purpose. In this embodiment, two terminal portions are formed for a chip for a TEG.

The substrate 900 corresponds to a glass substrate, a quartz substrate, a plastic substrate, an acrylic substrate, or the like. The substrate 900 can be easily manufactured to have a length of 1 m or more on a side, and can have a desired shape such as a square or circular shape. Therefore, when the substrate 900 has a size of 1 m or more on a side, for example, the productivity can be drastically increased. This characteristic is a significant advantage, compared with the case of taking wireless chips out of a circular silicon substrate.

The element layer 901 includes a plurality of insulating films, a semiconductor layer and a conductive layer for forming a plurality of elements, a conductive layer serving as an antenna, and a terminal portion. Specifically, the element layer in a region later to be a wireless chip includes a first insulating film serving as a base film, a plurality of elements provided over the first insulating film, a second insulating film covering the plurality of elements, a first conductive layer which is connected to the plurality of elements and is in contact with the second insulating film, a third insulating film covering the first conductive layer, a second conductive layer which serves as an antenna and is in contact with the third insulating film, and a fourth insulating film covering the second conductive layer. The element layer in a region later to be a TEG includes a first insulating film serving as a base film; an element provided over the first insulating film; a second insulating film covering the element; a first conductive layer which serves as a terminal portion, is in contact with the second insulating film, and is connected to the element; a third insulating film covering the first conductive layer; and a forth insulating film provided over the third insulating film. A more specific structure thereof will be described in Embodiment 4.

Figure 12:
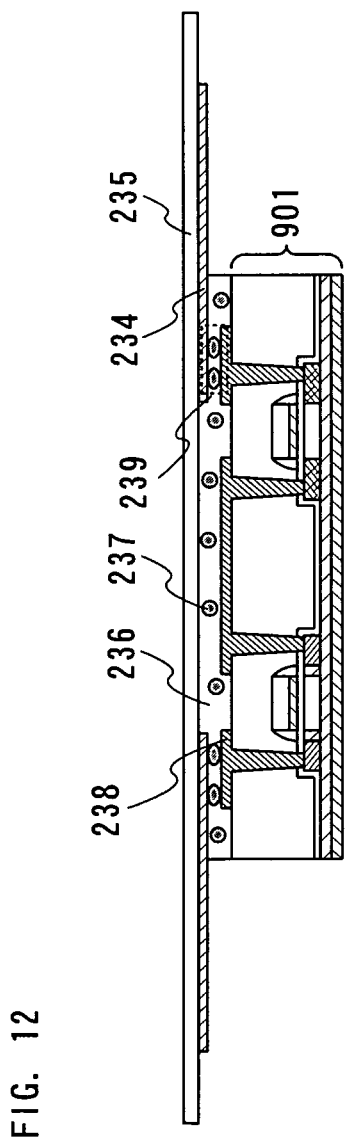
FIG. 12 explains Embodiment 2.

Note that described here is the example of forming the conductive layer functioning as an antenna in the element layer 901; however, an antenna substrate in which an antenna has been provided in advance may be bonded to the element layer 901 by a conductive adhesive agent or the like, without forming an antenna in the element layer 901 as shown in FIG. 12.

In FIG. 12, an anisotropic conductive adhesive agent 236 in which conductors 237 are scattered is used as a means for bonding the element layer 901, which is transferred from the substrate 900, to an antenna substrate 235. In the anisotropic conductive adhesive agent 236, conductivity can be obtained since the conductors 237 are pressure-bonded to a wiring 238 of the wireless chip and an antenna 234 in a region 239 in which the wiring 238 of the wireless chip and the antenna 234 are provided. In the other region, conductors 237 exist with a sufficient interval kept therebetween and thus, electrical connection is not obtained. As the anisotropic conductive adhesive agent 236, an anisotropic conductive paste or anisotropic conductive film can be used. Instead of using the anisotropic conductive adhesive agent, a method of bonding metal and metal with ultrasonic wave (referred to as an "ultrasonic bonding") may be used. Alternatively, bonding may be performed with an ultraviolet curing resin, a two-sided tape, or the like.

Next, a third film 902 is provided so as to cover the element layer 901 (or so as to cover the antenna substrate 235 in the case of bonding the antenna substrate 235 onto the TFT substrate as shown in FIG. 12). The third film 902 is a protective film for protecting the element layer 901. Note that the material which can be used for the first film 203 and the second film 204 as described in Embodiment Mode 1 can be appropriately used as a material of the third film.

Then, a fourth film 903 is provided to cover the third film 902. A film having a property of expanding when being pulled (an expand film) such as a film of a vinyl chloride resin, a silicone resin, or the like is used as the fourth film 903. Further, the fourth film 903 preferably has properties that the adhesion force is high at room temperature but becomes lower by light irradiation. Specifically, a UV tape whose adhesion force becomes lower by irradiation of ultraviolet light is preferably used.

Note that the third film 902 may be provided as necessary. The third film 902 is provided so as to protect the element layer 901. When the element layer 901 is not required to be protected, the fourth film 903 may be provided on the second film without providing the third film 902.

Figure 11B:
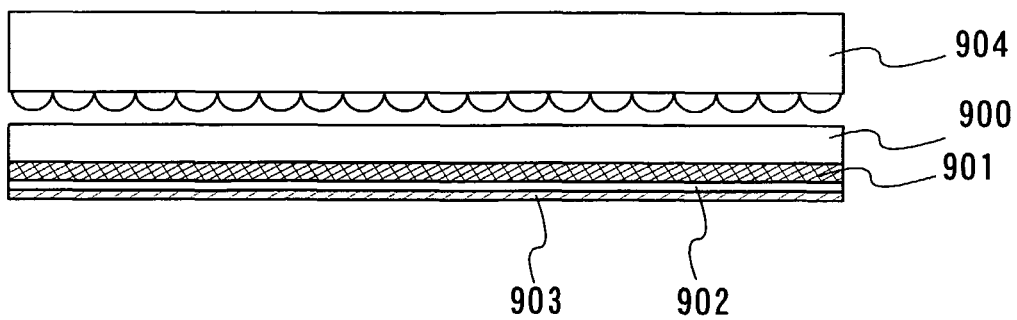

Next, the surface opposite to the one surface of the substrate 900 on which the element layer 901 has been formed, is ground by a grinding means 904 (FIG. 11B). The substrate 900 is preferably ground until the thickness becomes 100 μm or less. In the embodiment, the substrate 900 is ground until the thickness becomes 50 μm. Note that when the substrate has a thickness of 100 μm or less, the substrate has flexibility. In general, in this grinding step, the surface of the substrate 900 is ground by rotating one or both of a stage with the substrate 900 fixed and the grinding means 904. The grinding means 904 corresponds to, for example, a grindstone.

Figure 11C:
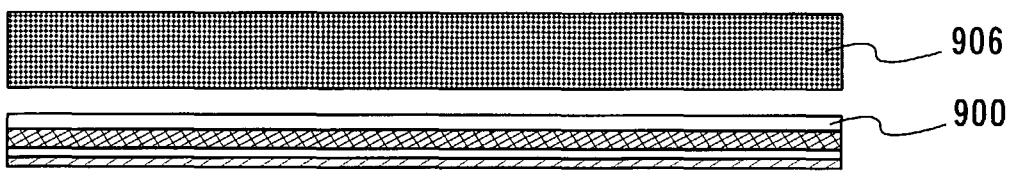

Next, the ground surface of the substrate 900 is polished by a polishing means 906 (see FIG. 11C). The substrate 900 is preferably polished until the thickness thereof becomes 20 μm or less. In this embodiment, the substrate 900 is polished until the thickness thereof becomes 10 μm. This polishing step is carried out, in the same way as the above-described grinding step, by rotating one or both of the stage with the substrate 900 fixed and the polishing means 906. The polishing means 906 corresponds to, for example, a grindstone.

After that, the substrate is washed as necessary in order to remove a dust generated in the grinding or polishing step. In this case, water droplets generated by the washing are removed by drying naturally or by a drying means. Specifically, as the drying means, there are a method of rotating the substrate 900, a method of blowing a gas such as air (atmosphere) to the substrate 900 with a blower, or the like.

Figure 11D:
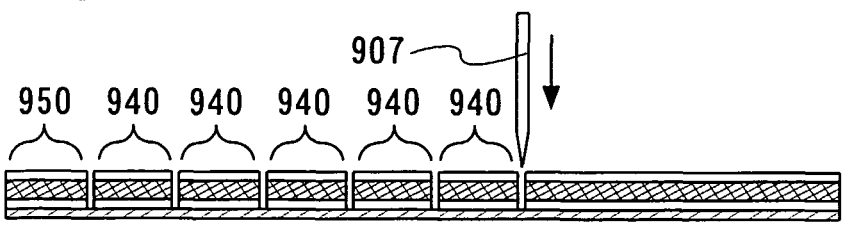

Then, cutting is performed to the substrate 900, the element layer 901, and the third film 902 by a cutting means 907. As to the element layer 901, each boundary between integrated circuits is cut so as to separate the plurality of integrated circuits from one another. Elements provided in the element layer 901 are not cut, but the insulating film provided in the element layer 901 is cut. Through this cutting step, therefore, elements 940 to be wireless chips and an element 950 to be a chip for a TEG are formed (see FIG. 11D). The cutting means 907 corresponds to a dicer, a laser, a wire saw, or the like. In this step, the fourth film 903 is not cut.

Figure 13A:
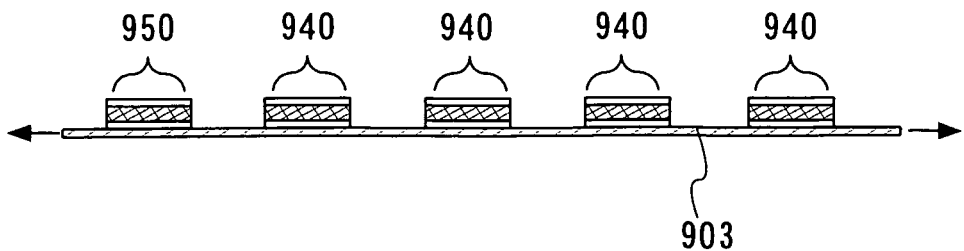
FIGS. 13A to 13D explain Embodiment 2.

Next, the fourth film 903 is expanded so as to form a space between the elements 940 to be wireless chips and between the element 940 to be a wireless chip and the element 950 to be a chip for a TEG (see FIG. 13A). At this time, the fourth film 903 is preferably pulled uniformly in directions parallel to a surface of the fourth film 903 as indicated by the arrows in FIG. 13A in order to form each space uniformly between the elements 940 to be wireless chips and between the element 940 to be a wireless chip and the element 950 to be a chip for a TEG. Subsequently, the fourth film 903 is irradiated with light. If the fourth film 903 is a UV tape, the fourth film 903 is irradiated with ultraviolet light. Then, the adhesion force of the fourth film 903 decreases, and the adhesiveness between the fourth film 903 and the element 940 to be a wireless chip or between the fourth film 903 and the element 950 to be a chip for a TEG is lowered. Thus, a state is obtained in which the elements 940 to be wireless chips and the element 950 to be a chip for a TEG can be separated from the fourth film 903 by a physical means.

Figure 13B:
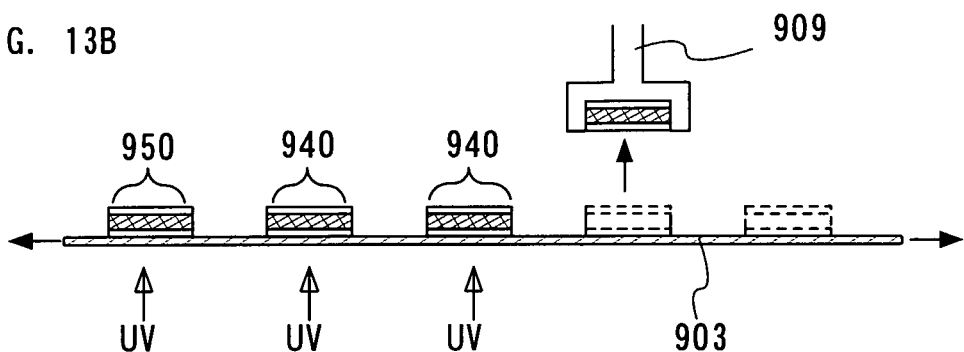
Figure 13C:
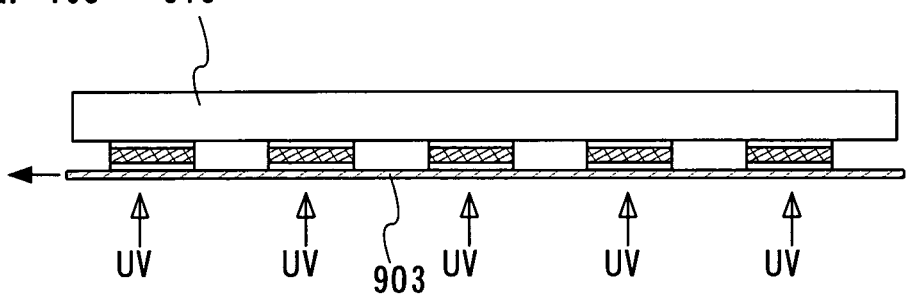
Figure 13D:
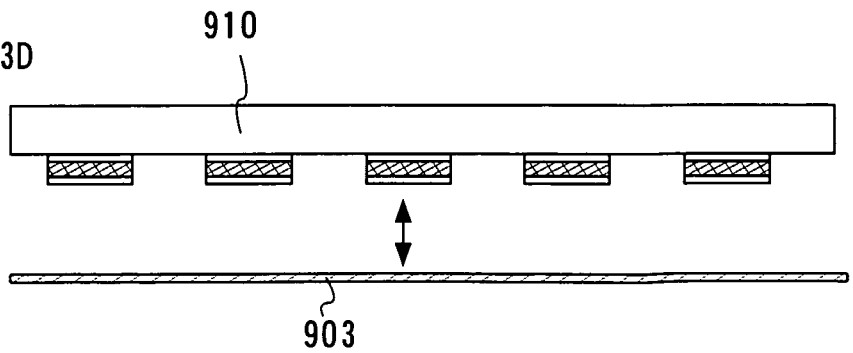

A pick-up means or an attachment means (vacuum chuck) may be employed as the physical means. When the pick-up means is adopted, as shown in FIG. 13B, the fourth film 903 is irradiated with UV light and the elements 940 to be wireless chips and the element 950 to be a chip for a TEG are separated from the fourth film 903 by the pick-up means 909, and then, the elements 940 to be wireless chips and the element 950 to be a chip for a TEG are arranged on the first film 203. When the vacuum chuck is adopted, as shown in FIG. 13C, the fourth film 903 is irradiated with UV light and a vacuum chuck 910 is positioned over the elements 940 to be wireless chips and the element 950 to be a chip for a TEG. Then, the elements 940 to be wireless chips and the element 950 to be a chip for a TEG are transferred onto the first film 203 with the elements 940 to be wireless chips and the element 950 to be a chip for a TEG held by the vacuum chuck 910 (see FIG. 13D).

In the aforementioned process, the cutting step (see FIG. 11D) of the substrate 900 is performed after the grinding step (see FIG. 11B) and polishing step (see FIG. 11C) of the substrate 900. However, the order of the steps is not limited to this. The substrate 900 may be ground and polished after cutting the substrate 900 as well.

The wireless chips and the chip for a TEG completed through the above-described steps have a thin thickness and a light weight. By setting the thickness of the substrate at 100 μm or less as in the embodiment, the wireless chips and the chip for a TEG having flexibility can be manufactured. Note that this embodiment can be freely combined with the embodiment modes described above or the other embodiments.

Embodiment 3

In Embodiment 3, a different method from the method of sealing and cutting the wireless chip and the chip for a TEG as described in Embodiment Mode 1 will be described. In other words, the case where the wireless chip and the chip for a TEG are sealed and cut simultaneously is described in Embodiment Mode 1; however, the sealing and cutting are not necessarily performed simultaneously and may be performed in different steps. Hereinafter, the method of performing sealing and cutting in different steps will be described.

As an example of performing sealing and cutting in different steps, for example, the following method can be given: irradiation of laser light having energy density capable of only sealing but not cutting is performed so as to perform sealing, and then irradiation of laser light having energy density capable of cutting is performed so as to perform cutting. In this case, the width of the laser light used for sealing is made larger than that of the laser light for cutting. By making the width of the laser light for sealing larger than that of the laser light for cutting, an area for bonding the first and the second films can be made large. Thus, sealing can be more surely performed, as compared with the case where sealing and cutting are performed simultaneously. In addition, when sealing and cutting are performed in different steps, either sealing or cutting may be performed first.

In addition, as another example of performing sealing and cutting in different steps, there is also given a method in which a heated wire which has a larger width than that of the heated wire 208 shown in FIG. 9, is pressed onto the second film 204 to perform only sealing and then, cutting is performed by the heated wire 208 or laser light. By making the width of the wire for sealing larger than that of the wire or laser light for cutting, sealing can be performed in such a way that the area for bonding the first and the second films can be made larger than the cut area. In addition, either sealing or cutting may be conducted first. Note that the embodiment can be freely combined with the above-described embodiment modes or the other embodiments.

Embodiment 4

Figure 14:
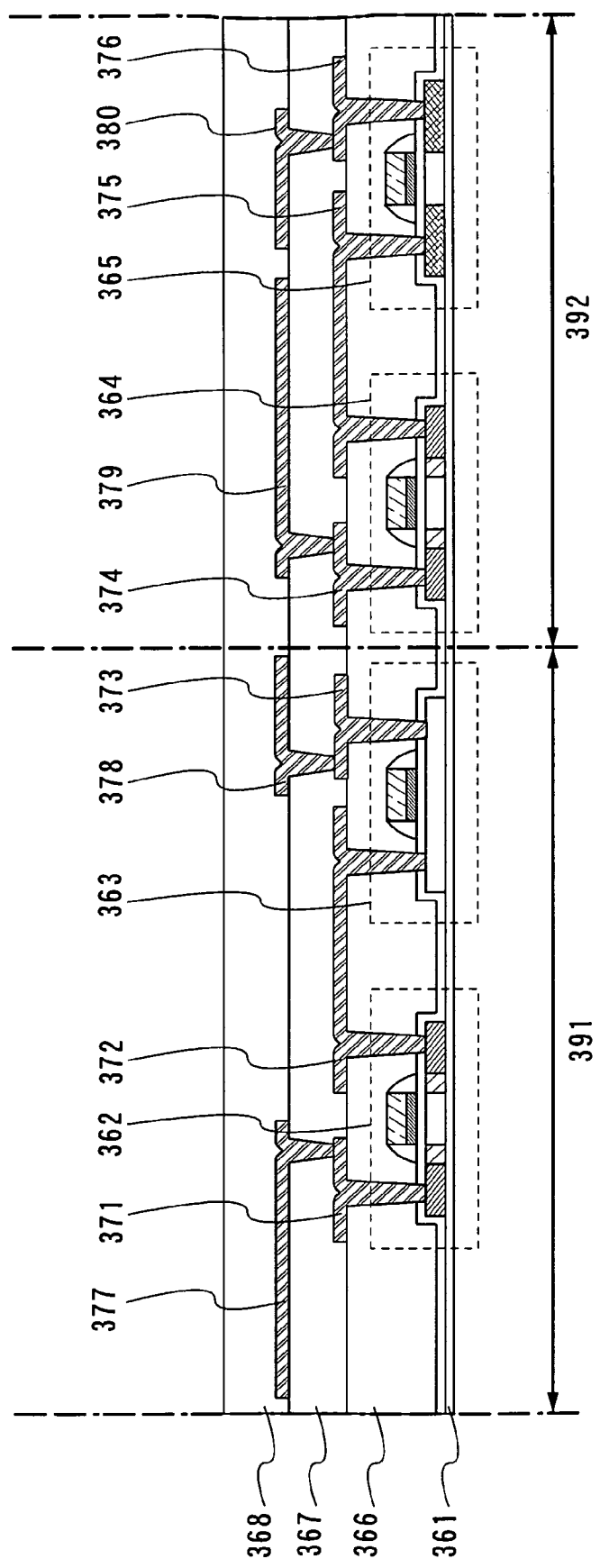
FIG. 14 explains Embodiment 4.

Embodiment 4 specifically describes an example of a structure of the element layer, with reference to FIG. 14. In FIG. 14, a region later to be a chip for a TEG (TEG portion 391) and a region to be a wireless chip (wireless chip portion 392) are shown.

Reference numeral 361 denotes an insulating film serving as a base film. The insulating film 361 includes stacked films of silicon nitride oxide and silicon oxynitride, stacked films of silicon oxynitride, silicon nitride oxide, and silicon oxynitride, stacked films of silicon oxide, silicon nitride oxide, and silicon oxynitride, or the like.

A plurality of elements is formed over the insulating film 361. The plurality of elements correspond to, for example, a plurality of elements selected from a thin film transistor, a capacitor element, a resistor element, a diode, or the like. FIG. 14 shows a cross-sectional structure in the case where N-channel type thin film transistors 362 and 364, and P-channel type thin film transistors 363 and 365 are formed as the plurality of elements. Each of the thin film transistors 362 and 364 has an LDD (Lightly Doped Drain) structure including a channel formation region, a lightly-doped impurity region, and a heavily-doped impurity region. Each of the thin film transistors 363 and 365 has a single-drain structure including a channel formation region and an impurity region. Sidewalls are formed on side faces of gate electrodes of the thin film transistors 362 to 365.

Note that the structure of the thin film transistor is not limited to the above description, and any structure is applicable. For example, the single-drain structure, an off-set structure, the LDD structure, a GOLD (Gate Overlapped Lightly Doped drain) structure, or the like may be employed.

An insulating film 366 is formed so as to cover the thin film transistors 362 to 365. Source or drain wirings 371 to 376 electrically connected to the impurity regions of the thin film transistors 362 to 365 are formed over the insulating film 366. An insulating film 367 is formed so as to cover the source or drain wirings 371 to 376. Conductive layers 377 to 380 electrically connected to the source or drain wirings 371 to 376 are formed over the insulating film 367. As to the conductive layers 377 to 380, the conductive layers 377 and 378 which are provided in the TEG portion 391 function as terminal portions, and the conductive layers 379 and 380 which are provided in the wireless chip portion 392 function as antennas. An insulating film 368 is formed so as to cover the conductive layers 377 to 380.

This embodiment describes the example of forming the conductive layers 379 and 380 serving as antennas in the element layer of the wireless chip portion; however, a structure may be employed, in which an antenna substrate provided with an antenna in advance is bonded to the element layer such that the antenna is electrically connected to the element layer, instead of forming the antenna in the element layer.

In addition, this embodiment shows a structure in which an antenna is not provided in the TEG portion; however, a structure in which an antenna is provided to the TEG portion may be employed. By providing, to the TEG portion, the same structure as that of the circuit of the wireless chip provided with an antenna, electric characteristics of the circuit of the wireless chip can be figured out more surely than the case of the structure without providing an antenna. Note that this embodiment can be freely combined with the embodiment modes described above or the other embodiments.

Embodiment 5

Figure 15:
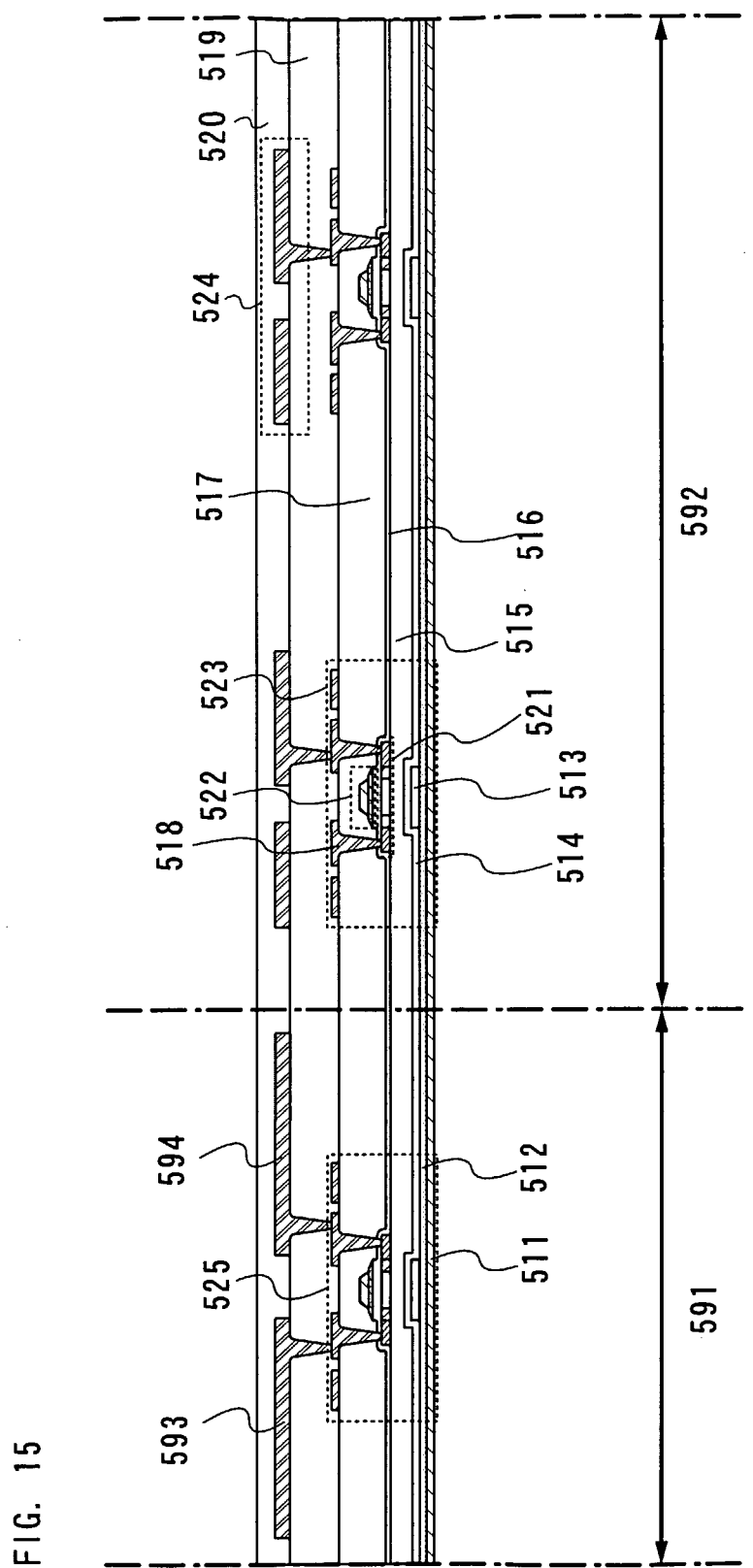
FIG. 15 explains Embodiment 5.

Embodiment 5 describes an example of a structure of an element layer different from that in Embodiment 4, with reference to FIG. 15. In FIG. 15, a region later to be a chip for a TEG (TEG portion 591) and a region to be wireless chips (wireless chip portion 592) are shown.

A silicon nitride film 511 and a silicon oxide film 512 are insulating films serving as base films. A plurality of elements is formed over the silicon oxide film 512. Herein, the silicon nitride film 511 and the silicon oxide film 512 serving as the base insulating films are not limited to these materials and the order of stacking the films. As the base insulating film, for example, a stacked film of silicon nitride oxide and silicon oxynitride, a stacked film of silicon oxynitride, silicon nitride oxide, and silicon oxynitride, a stacked film of silicon oxide, silicon nitride oxide, and silicon oxynitride, or the like may be employed as well.

In addition, the plurality of elements corresponds to, for example, a plurality of elements selected from a thin film transistor, a capacitor element, a resistor element, a diode, or the like. FIG. 15 shows a cross-sectional structure in the case where a plurality of thin film transistors 523, as the plurality of elements, each having a structure in which a channel region of a semiconductor layer 521 is interposed between a lower electrode 513 and a gate electrode 522 through an insulating film is formed.

Hereinafter, a structure of the thin film transistor 523 is described. Note that a thin film transistor 525 provided in the TEG portion 591 has the same structure as that of the thin film transistor 523.

Insulating films 514 and 515 are formed over the lower electrode 513, and the semiconductor layer 521 is formed over the insulating film 515. Here, the lower electrode 513 can be formed by using a metal or a polycrystalline semiconductor doped with an impurity having one conductivity type. In the case of using a metal, W, Mo, Ti, Ta, Al, or the like can be used.

The gate electrode 522 is formed over the semiconductor layer 521 with a gate insulating film 516 interposed therebetween. In FIG. 15, the thin film transistor 523 is a thin film transistor having a GOLD structure; however, the invention is not limited to this structure. For example, an LDD structure having sidewalls on side faces of the gate electrode may be adopted as well.

Then, an insulating film 517 is formed to cover the semiconductor layer 521 and the gate electrode 522. A source or drain wiring 518 electrically connected to a source or drain region in the semiconductor layer 521 is formed over the insulating film 517.

An insulating film 519 is formed over the source or drain wiring 518, and conductive layers 524, 593, and 594 are formed over the insulating film 519. As for the conductive layers 524, 593, and 594, the conductive layers 593 and 594 which are provided in the TEG portion 591 serve as terminal portions. The conductive layer 524 which are provided in the wireless chip portion 592 serves as an antenna. Then, an insulating film 520 is formed to cover the conductive layer 524.

As the insulating films 515, 517, 519, and 520, an inorganic insulating film or an organic insulating film can be used. A silicon oxide film or a silicon oxynitride film formed by a CVD method, a silicon oxide film applied by an SOG (Spin On Glass) method, or the like can be used as the inorganic insulating film. A film of polyimide, polyamide, BCB (benzocyclobutene), acrylic, a positive photosensitive organic resin, a negative photosensitive organic resin, or the like can be used as the organic insulating film. Moreover, a stack structure of films formed of different materials, such as a stack structure of an acrylic film and a silicon oxynitride film, may be used as well.

The TFT having the lower electrode as described above has an advantageous structure in reducing a size thereof. In general, when the size of a TFT is reduced and the clock frequency for driving a circuit is increased, power consumption of an integrated circuit is increased. Therefore, by applying a bias voltage to the lower electrode and varying the bias voltage, a threshold voltage of the TFT can be changed. Accordingly, increase of power consumption can be suppressed.

The application of a negative bias voltage to the lower electrode of an N-channel TFT increases a threshold voltage and reduces leakage. On the contrary, the application of a positive bias voltage decreases the threshold voltage to make current easily flow to the channel, the TFT can operate at higher speed or at a low voltage. The application of a bias voltage to the lower electrode of a P-channel TFT exhibits an opposite effect thereof. Thus, the characteristics of an integrated circuit can be drastically improved by controlling the bias voltage applied to the lower electrode.

By balancing the threshold voltages of the N-channel TFT and the P-channel TFT with the bias voltage, the characteristics of an integrated circuit can be improved. In this case, both a power source voltage and the bias voltage applied to the lower electrode may be controlled in order to reduce power consumption. When the circuit is in a standby mode, a large reverse bias voltage is applied. In an operation mode, a small reverse bias voltage is applied when load is small, whereas a small forward bias voltage is applied when the load is large. The application of the bias voltage may be switched by providing a control circuit, depending on the operation state or load state of the circuit. By controlling power consumption or TFT performance in such a way, circuit performance can be maximized.

This embodiment describes the example in which the conductive layer 524 serving as an antenna is formed in the element layer of the wireless chip portion. However, a structure may be employed, in which an antenna substrate provided with an antenna in advance is bonded to the element layer so that the antenna is electrically connected to the element layer, instead of forming the antenna in the element layer.

In this embodiment, a structure is described, in which an antenna is not provided in the TEG portion. However, a structure in which the antenna is provided in the TEG portion may be employed. By employing, to the TEG portion, the same structure as that of the circuit of the wireless chip provided with an antenna, electric characteristics of the circuit of the wireless chip can be figured out more surely, than the case of the structure without the antenna provided. Note that this embodiment can be freely combined with the embodiment modes described above or the other embodiments.

Embodiment 6

Embodiment 6 describes an example of the case where a crystalline semiconductor layer which has been crystallized by laser light irradiation is used as a semiconductor layer of a thin film transistor included in an element layer.

As an oscillator for generating laser light, a continuous wave laser can be used. The oscillator may employ one or a plurality of types of continuous wave lasers selected from a YAG laser, a $YVO_4$ laser, a YLF laser, a $YAlO_3$ laser, a glass laser, a ruby laser, an alexandrite laser, a Ti:sapphire laser, an excimer laser, an Ar laser, a Kr laser, and a $CO_2$ laser.

With such a continuous wave laser, it is possible to manufacture a transistor using a polycrystalline semiconductor having few crystal defects and having a large crystal grain. It is possible to provide a semiconductor device in which the mobility and the response speed are favorable, thus, the driving speed can be high and the operation frequency of an element is increased. Further, the high reliability can be obtained because variations on characteristics are few.

For further increasing the operation frequency, a scanning direction of laser light is preferably the same as a channel length direction of the transistor. This is because the highest mobility can be obtained when the channel length direction of the transistor and the scanning direction of laser light with respect to a substrate are almost parallel (preferably, from −30° to 30°), in a step of laser crystallization by the continuous wave laser. Note that the channel length direction corresponds to a flowing direction of current in the channel formation region, in other words, a direction in which an electric charge moves. The thus-formed transistor includes an active layer formed of a polycrystalline semiconductor in which crystal grains are extended in the channel length direction, which means that crystal grain boundaries are formed almost along the channel length direction.

In addition, the laser crystallization using the continuous wave laser is described; however, the invention is not limited to the continuous wave laser, and a pulsed laser may be used for the laser crystallization as well. Even when an energy beam (pulsed beam) is output in a pulsed oscillation, crystal grains continuously grown in the scanning direction can be obtained by emitting laser light with a repetition rate sufficient to emit next pulsed laser light, after a semiconductor film is melted by laser light and before it is solidified. In other words, even when a pulsed laser is adopted, the same effect as that of the continuous wave laser can be obtained.

Therefore, a pulsed beam having a determined lower limit of the repetition rate may be used so that the pulse cycle becomes shorter than a period from melting of the semiconductor film to being solidified. Specifically, the repetition rate of the pulsed laser is 10 MHz or more, and preferably 60 MHz to 100 MHz. The frequency band much higher than that of several tens to several hundreds Hz which is a frequency band of a typically used pulsed laser, is used.

When the above-described frequency band is used, it is possible to irradiate the semiconductor film with pulsed laser light before the semiconductor film is solidified after it has been melted by previous laser light. Therefore, unlike the case of using a pulsed laser having the conventional frequency band, the interface between the solid phase and the liquid phase can be moved continuously in the semiconductor film, and the semiconductor film having crystal grains grown continuously in the scanning direction can be formed. Specifically, it is possible to form an aggregation of crystal grains each of which has a width of 10 μm to 30 μm in the scanning direction and a width of approximately 1 μm to 5 μm in a direction perpendicular to the scanning direction. Accordingly, crystal grains almost the same as those in the case of the continuous waver laser can be obtained. It is also possible to form a semiconductor film having almost no crystal grain boundaries at least in the channel length direction of a TFT, by forming single crystal grains long extended along the scanning direction.

As the pulsed laser, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, or a gold vapor laser which can oscillate at the above described oscillating frequency, can be used. Note that this embodiment can be freely combined with the embodiment modes described above or the other embodiments.

Embodiment 7

Embodiment 7 describes an example of a circuit configuration of a chip for a TEG. The chip for a TEG includes an element for checking electric characteristics of a single element such as a transistor, in addition to including the same circuit as the wireless chip. In addition, the specification of the chip for a TEG explained here conforms to ISO (International Organization for Standardization) Standard 15693, which is a vicinity type and whose communication signal frequency is 13.56 MHz. In addition, the reception responds only to a data readout instruction, the data transmission rate of the sending is approximately 13 kHz, and a Manchester code is used for data coding.

Figure 16:
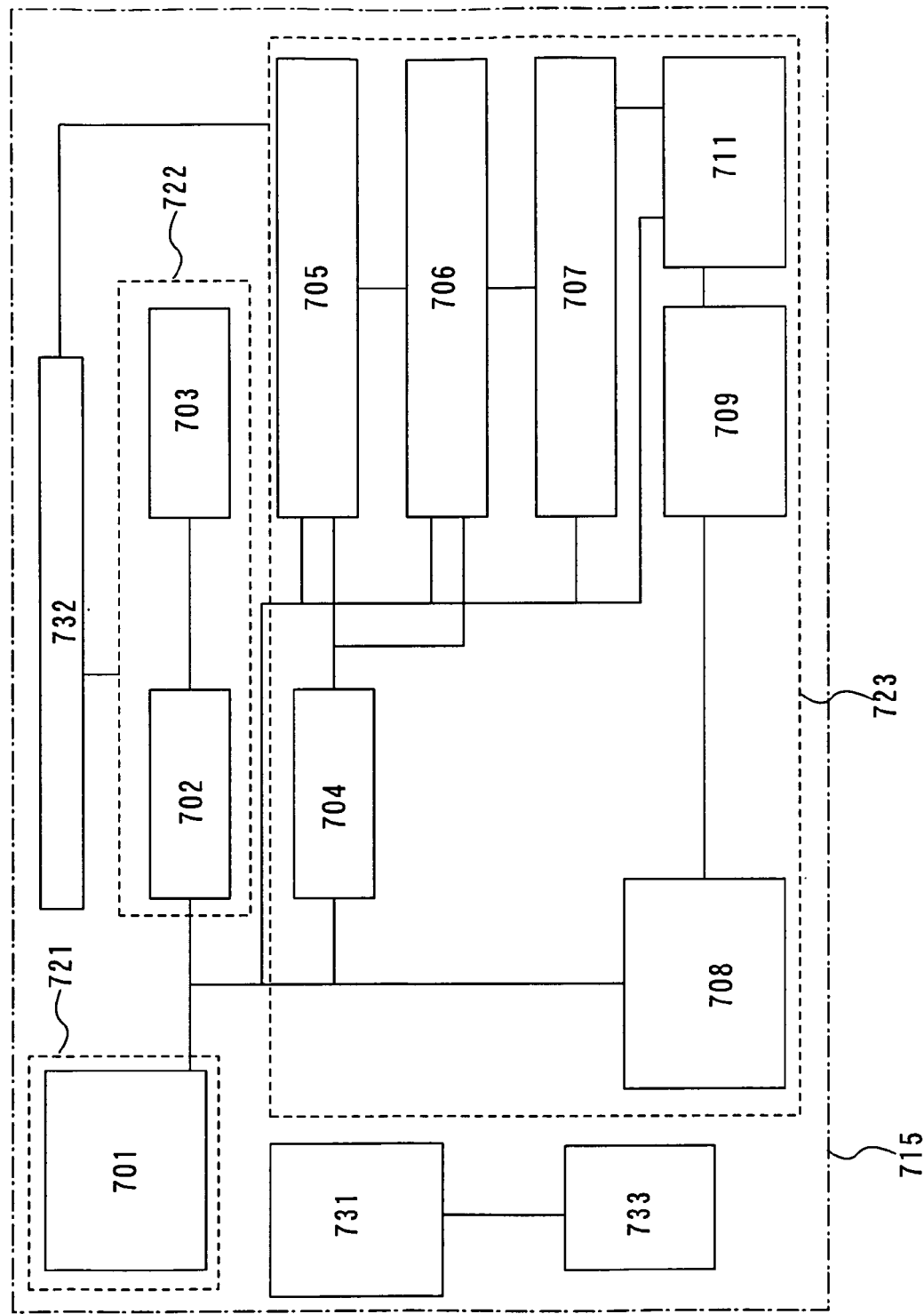
FIG. 16 explains Embodiment 7.

As shown in FIG. 16, a chip for a TEG 715 is roughly divided into an antenna portion 721, a power supply portion 722, a logic portion 723, and a terminal portion. The antenna portion 721 includes an antenna 701 for receiving an external signal and transmitting data.

The power supply portion 722 includes a rectifying circuit 702 that generates a power source by a signal received from the outside via the antenna 701, and a storage capacitor 703 for storing the generated power source. The logic portion 723 includes a demodulation circuit 704 for demodulating the received signal, a clock generation-compensation circuit 705 for generating a clock signal, a circuit for recognizing and determining each code 706, a memory controller 707 that generates a signal for reading out data from a memory by using the received signal, a modulation circuit and modulation resistor 708 for transmitting an encoded signal to the received signal, an encoding circuit 709 for encoding the readout data, and a mask ROM 711 for holding data.

The terminal portion includes a first terminal portion 731 and a second terminal portion 732. The first terminal portion 731 is formed by pulling a wiring so as to measure electric characteristics or the like of a single element group 733 in which a plurality of single elements such as thin film transistors is provided. The second terminal portion 732 is formed by pulling (extending) a wiring so as to measure characteristics of the power supply portion 722 or the logic portion 723 as a circuit.

A code recognized and determined by the circuit for recognizing and determining each code 706 is an end of frame (EOF) signal, a start of frame (SOF) signal, a flag, a command code, a mask length, a mask value, or the like. In addition, the circuit for recognizing and determining each code 706 also has a cyclic redundancy check (CRC) function that identifies a transmission error.

Figure 17:
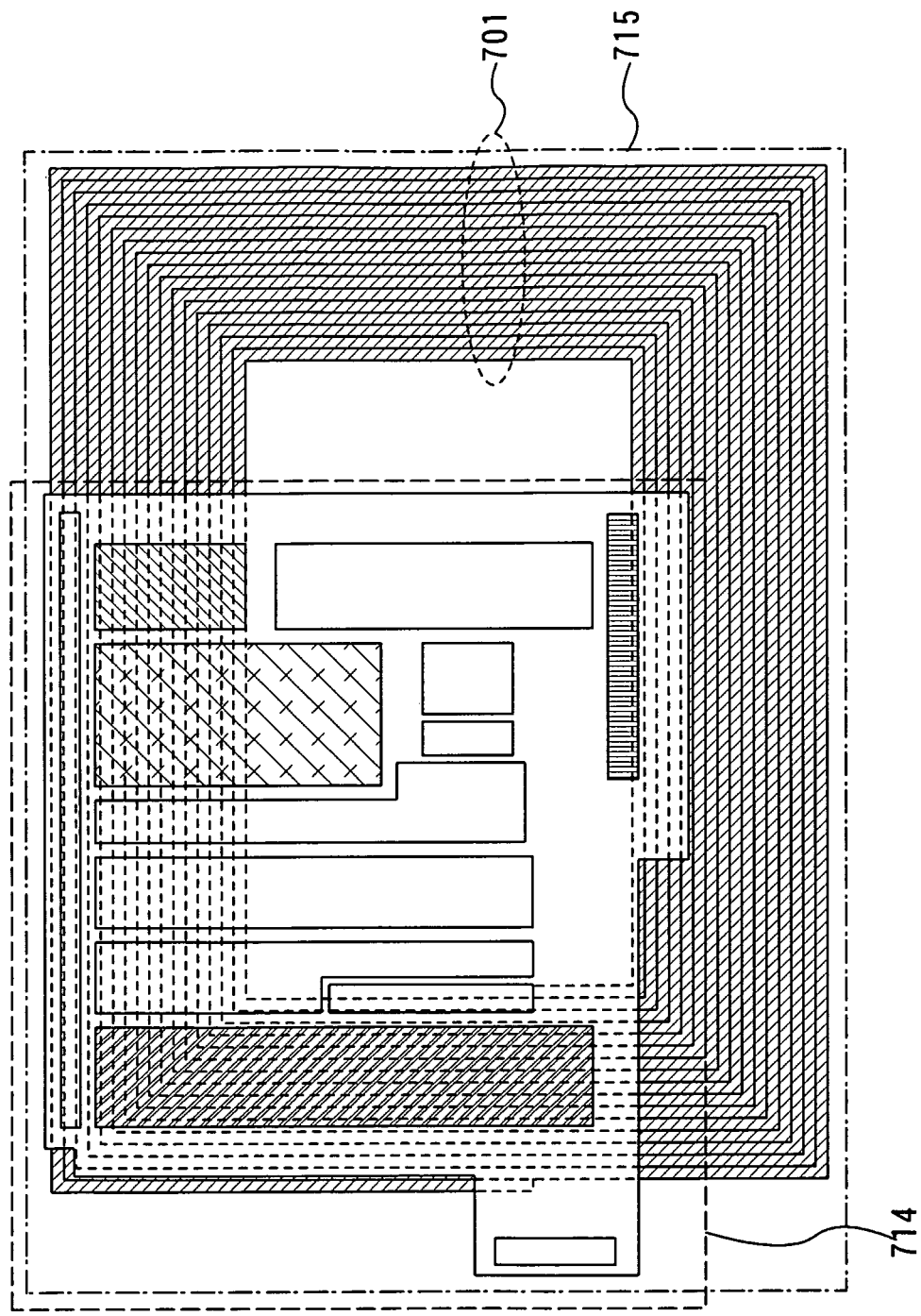
FIG. 17 explains Embodiment 7.
Figure 18:
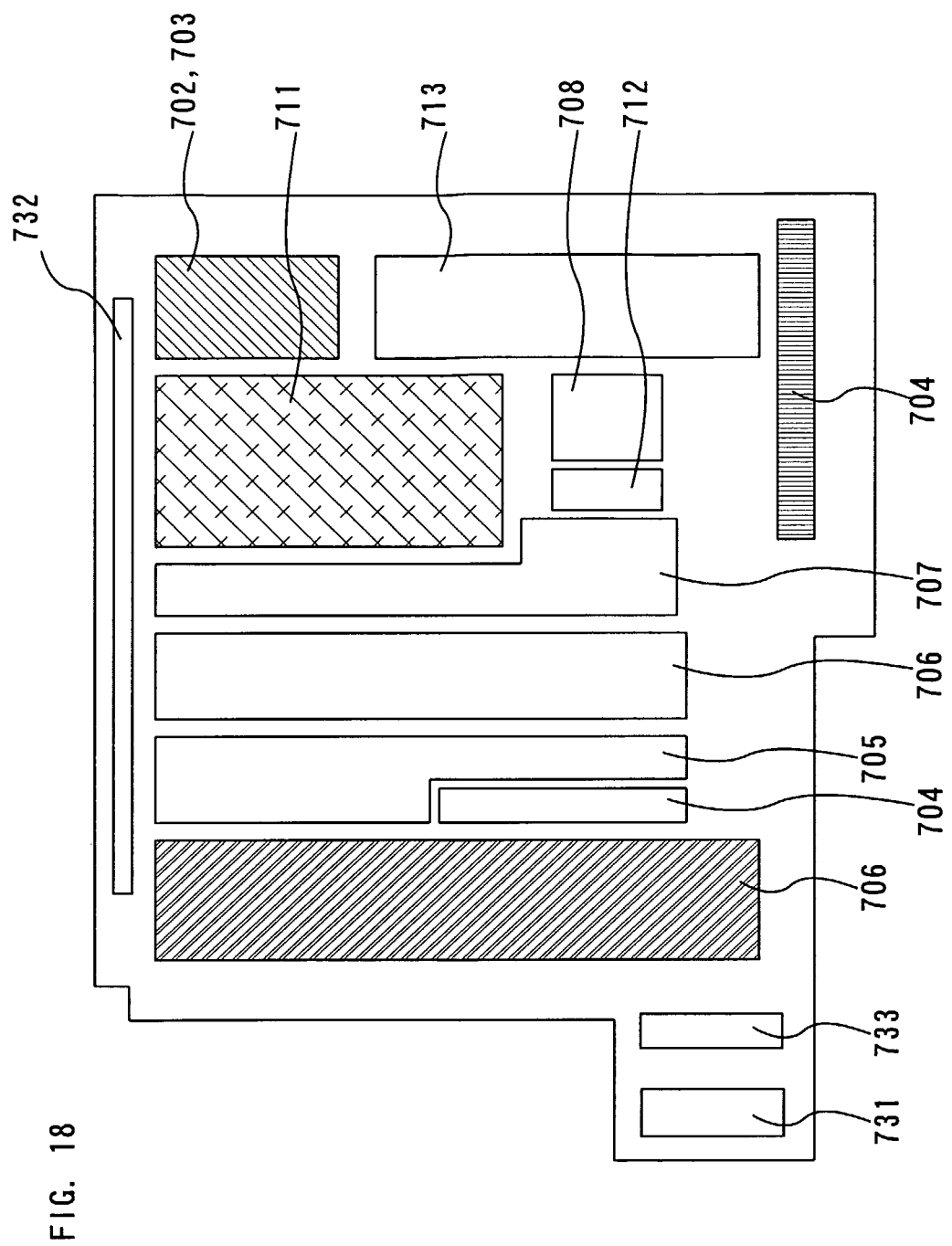
FIG. 18 explains Embodiment 7.

Next, one example of a layout of the chip for a TEG having the above structure is explained with reference to FIG. 17 and FIG. 18. First, an overall layout of one TEG is explained (see FIG. 17). In the chip for a TEG, an antenna 701 and an element group 714 including the power supply portion 722, the logic portion 723, and the terminal portion are formed in different layers. Specifically, the antenna 701 is formed over the element group 714. A part of the region where the element group 714 is formed is overlapped with a part of the region where the antenna 701 is formed. In the structure shown in FIG. 17, it is designed so that the width of a wiring forming the antenna 701 is 150 μm, the width of an interval between the wirings is 10 μm, and the number of windings thereof is 15. Note that the invention is not limited to the mode in which the antenna 701 and the element group 714 are formed in different layers as mentioned above. In addition, the antenna 701 is not limited to the winding shape as shown in FIG. 17.

Subsequently, the layouts of the power supply portion 722, the logic portion 723, and the terminal portions are explained (see FIG. 18). The rectifying circuit 702 and the storage capacitor 703 included in the power supply portion 722 are provided in the same region. Both the demodulation circuits 704 and the circuits for recognizing and determining each code 706, which form the logic portion 723, are provided in two places. The mask ROM 711 and the memory controller 707 are provided adjacently. The clock generation-compensation circuit 705 and the circuit for recognizing and determining each code 706 are provided adjacently. The demodulation circuit 704 is provided between the clock generation-compensation circuit 705 and the circuit for recognizing and determining each code 706. In addition, although not shown in the block diagram of FIG. 16, a detection capacitor for the logic portion 712 and a detection capacitor for a power supply portion 713 are provided. The modulation circuit and modulation resistor 708 is provided between the detection capacitors 712 and 713.

The terminal portion includes a first terminal portion 731 and a second terminal portion 732. The first terminal portion 731 is formed by pulling a wiring so as to measure electric characteristics or the like of a single element group 733 in which a plurality of single elements such as thin film transistors is provided. The second terminal portion 732 is formed by pulling a wiring so as to measure characteristics of the power supply portion 722 or the logic portion 723 as a circuit. The first terminal portion 731 and the single element group 733 may be formed in a space except a region where the power supply portion 722 and the logic portion 723 are provided. In addition, the second terminal portion 732 may be provided in a periphery of the region where the power supply portion 722 and the logic portion 723 are provided.

In the mask ROM 711, memory content is formed in a memory in the manufacturing process. Here, two power supply lines of a power supply line connected to a high-potential power supply (also referred to as VDD) and a power supply line connected to a low-potential power supply (also referred to as VSS) are provided, and the memory content each memory cell stores depends on which of the above power supply lines a transistor included in the memory cell is connected to.

Figure 19A:
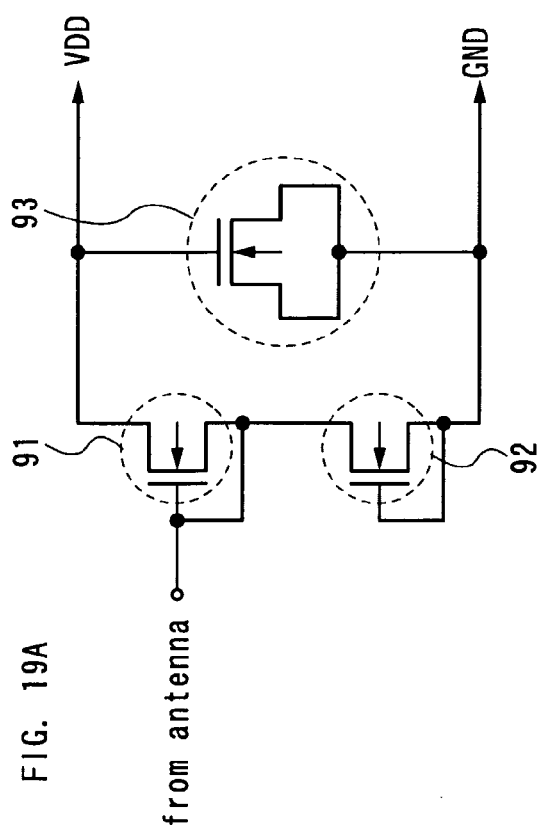
FIGS. 19A and 19B explain Embodiment 7.
Figure 19B:
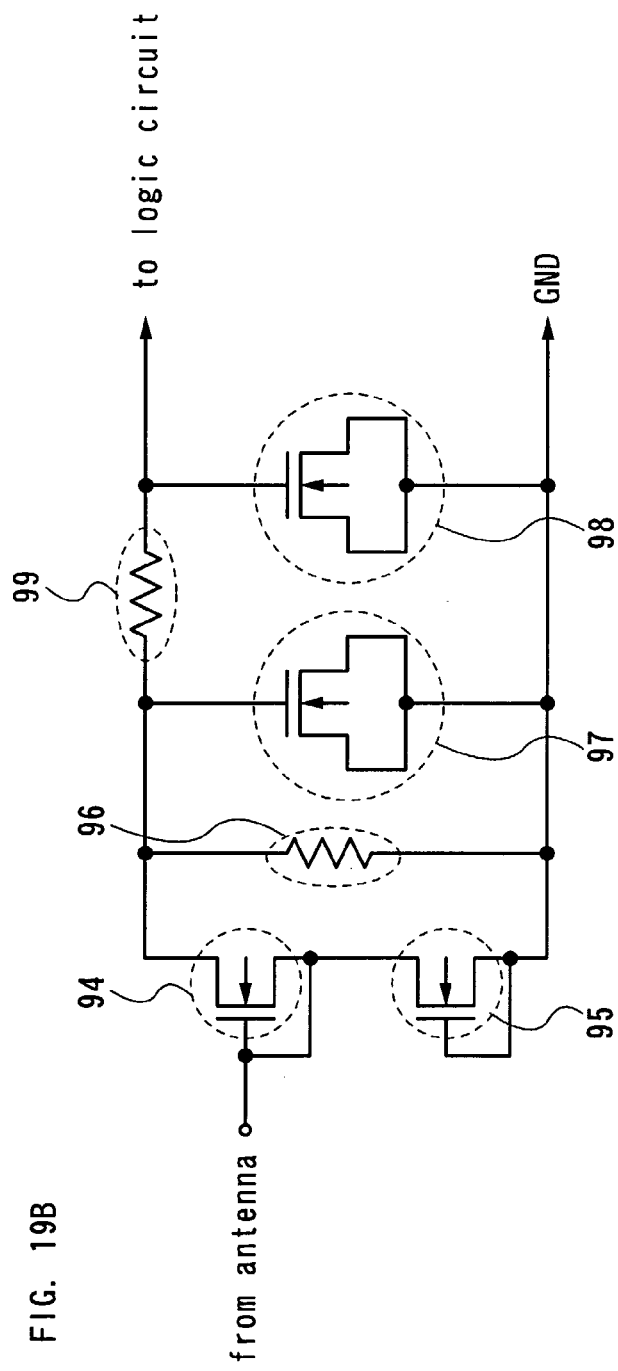

Next, one example of a circuit configuration of the rectifying circuit 702 is explained (see FIG. 19A). The rectifying circuit 702 includes transistors 91 and 92 and a capacitor transistor 93. The gate electrode of the transistor 91 is connected to the antenna 701. The gate electrode of the capacitor transistor 93 is connected to the high-potential power supply (VDD). In addition, the source and drain electrodes of the capacitor transistor 93 are connected to a ground power supply (GND). Subsequently, one example of a circuit configuration of the demodulation circuit 704 is explained (see FIG. 19B). The demodulation circuit 704 includes transistors 94 and 95, resistance elements 96 and 99, and capacitor transistors 97 and 98. The gate electrode of the transistor 94 is connected to the antenna 701. The gate electrode of the capacitor transistor 98 is connected to a logic circuit. The source and drain electrodes of the capacitor transistor 98 are connected to the ground power supply (GND).

Figure 20A:
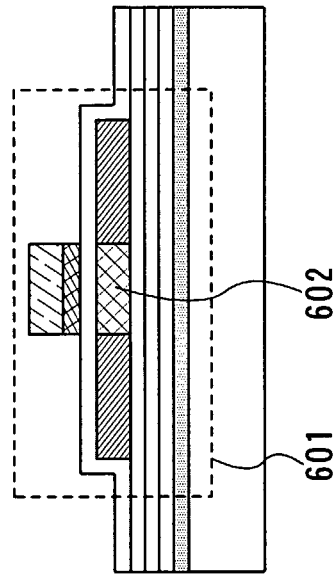
FIGS. 20A to 20D explain Embodiment 7.
Figure 20B:
Figure 20C:
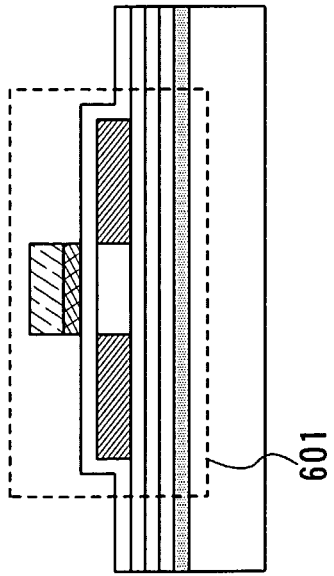
Figure 20D:
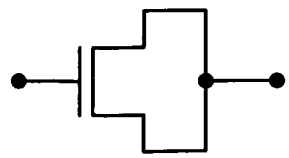

Next, a cross-sectional structure of the capacitor transistor included in the rectifying circuit 702 or the demodulation circuit 704 will be explained (see FIG. 20A). The source and drain electrodes of a capacitor transistor 601 are connected to each other. When the capacitor transistor 601 is turned on, capacitance is formed between the gate electrode and the channel formation region. The cross-sectional structure of the capacitor transistor 601 is the same as that of a usual thin film transistor. An equivalent circuit diagram thereof can be shown as in FIG. 20B. In the capacitance using a gate insulating film as in the above structure, it is influenced by the fluctuation of a threshold voltage of the transistor. Therefore, a region 602 overlapped with the gate electrode may be doped with an impurity element (see FIG. 20C). An equivalent circuit diagram in this case can be shown as in FIG. 20D. Note that this embodiment can be freely combined with the embodiment modes described above or the other embodiments.

Embodiment 8

In Embodiment 8, the application of the chip for a TEG in reusing it as a wireless chip will be described. The chip for a TEG is manufactured to include the terminal portion described in the embodiment mode or the embodiment, and passed a characteristic test, and then, it is sealed after cutting the terminal portion or after removing the wiring substrate having flexibility. In addition, the application of the wireless chip simultaneously manufactured as the chip for a TEG described in the above embodiment modes or embodiments will be described.

Figure 21A:
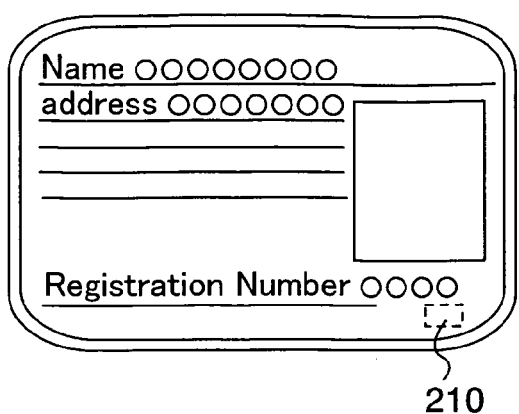
FIGS. 21A to 21E explain Embodiment 8.
Figure 21B:
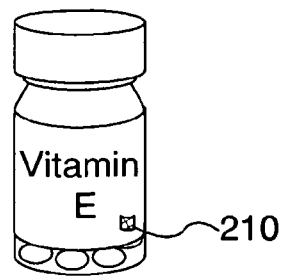
Figure 21C:
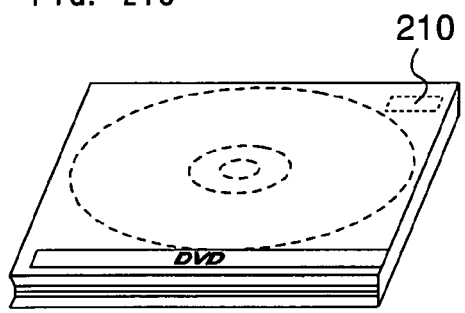
Figure 21D:
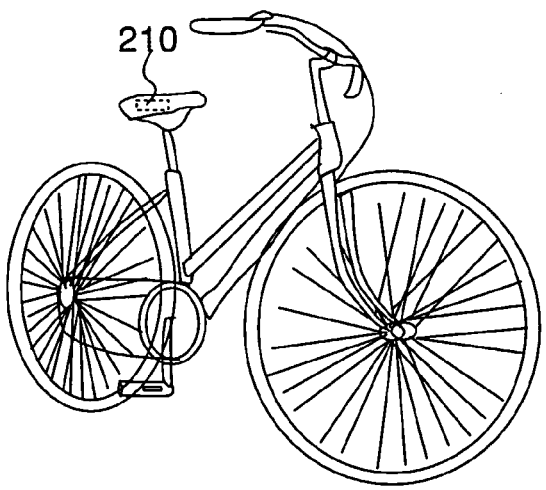
Figure 21E:
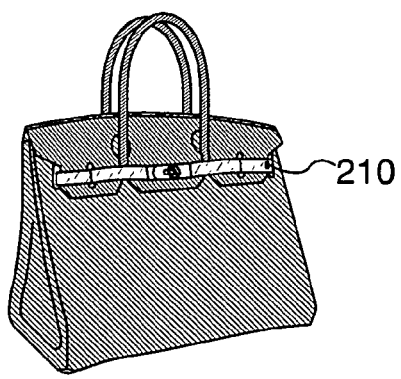

As examples of the application of the wireless chip, the wireless chip can be used by providing to paper money, coins, securities, bearer bonds, certificates (a driver's license, a certificate of residence, or the like, see FIG. 21A), packing containers (wrapping paper, bottles, or the like, see FIG. 21B), recording media such as DVD software, a CD, and a video tape (see FIG. 21C), vehicles such as a car, a motorcycle, and a bicycle (see FIG. 21D), personal belongings such as a bag and glasses (see FIG. 21E), foods, clothing, commodities, electronic devices, or the like. Note that the electronic devices refer to a liquid crystal display device, an EL display device, a television device (also called TV or TV sets), a cellular phone, and the like.

The wireless chip can be fixed to an article by attaching to a surface or embedding thereinto. For example, in a case of a book, the wireless chip may be embedded in paper; or in a case of a package made from an organic resin, the wireless chip may be embedded in the organic resin. Forgery can be prevented by providing the wireless chip to each of the paper money, coins, securities, bearer bonds, certificates, and the like. The efficiency of an inspection system or a system used in a rental shop can be promoted by providing the wireless chip to each of the packing containers, recording media, personal belongings, foods, clothing, commodities, electronic devices, and the like. By providing the wireless chip to the vehicles, counterfeits or theft can be prevented. In addition, by providing the wireless chip, which is for recording a previous disease or a history of taking medicine, to a health insurance card and checking the health insurance card when a doctor diagnoses, even in a case of going to a plurality of hospitals, it is prevented to make a wrong diagnosis on the kind of medicines, a dose amount, or the like.

Figure 22A:
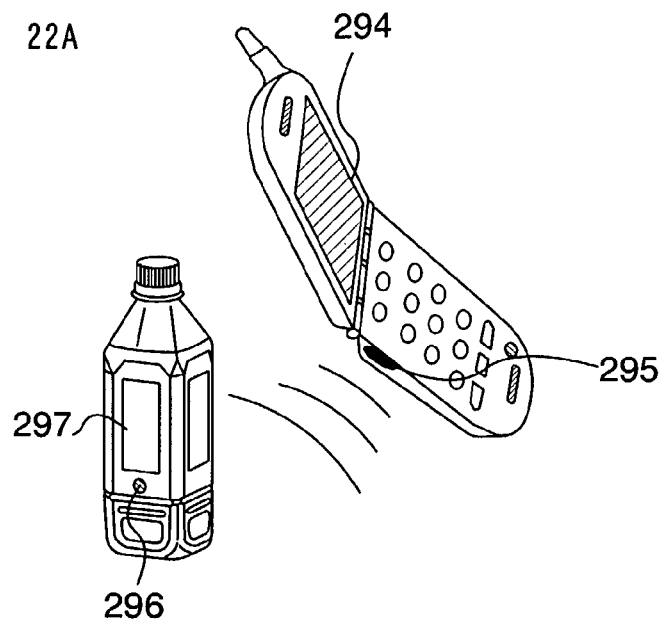
FIGS. 22A and 22B explain Embodiment 8.
Figure 22B:
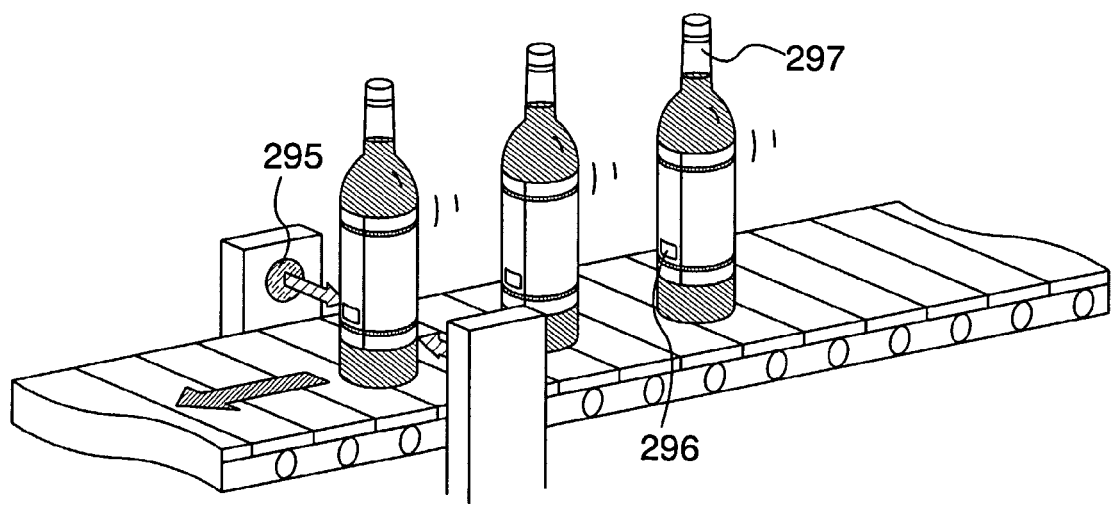

Further, by applying the wireless chip to a system for an article management or a distribution system, the system can be sophisticated. For example, considered is a case where a side surface of a portable terminal including a display portion 294 is provided with a reader/writer 295 and a wireless chip 296 is provided to a side surface of an article 297 (FIG. 22A). In this case, a system is formed to display information of the article 297, such as a material, a place of origin, or a history of a distribution process, in the display portion 294, when the wireless chip 296 is held to the reader/writer 295. As another example, in a case of providing the reader/writer 295 to a side of a conveyer belt, the article 297 can be easily inspected (FIG. 22B). Note that this embodiment can be freely combined with the above-described embodiment modes or the embodiments.

This application is based on Japanese Patent Application serial no. 2005-093295 filed in Japan Patent Office on Mar. 28, 2005, the entire contents of which are hereby incorporated by reference.

The invention claimed is:

1. A manufacturing method of a semiconductor device, comprising the steps of:
    forming a peeling layer over a substrate;
    forming an element layer provided with a test element including a terminal portion, over the peeling layer;
    selectively removing the peeling layer and the element layer to form an opening portion;
    separating the element layer from the substrate,
    sealing the element layer with a first film having flexibility and a second film having flexibility;
    removing the first film to form a contact hole reaching the terminal portion;

filling the contact hole with a resin containing a conductive material; and heating after arranging a wiring substrate having flexibility over the resin with which filling has been performed so that the terminal portion and the wiring substrate having flexibility are adhered to each other through the resin containing the conductive material.

2. A manufacturing method of a semiconductor device, comprising the steps of:

forming a peeling layer over a substrate;

forming an element layer provided with a test element including a terminal portion, over the peeling layer;

selectively removing the peeling layer and the element layer to form an opening portion;

separating the element layer from the substrate;

sealing the element layer with a first film having flexibility and a second film having flexibility;

removing the first film to expose the terminal portion; and adhering the exposed terminal portion and a wiring substrate having flexibility to each other by using an anisotropic conductive film.

3. The manufacturing method according to any one of claims 1 and 2, wherein the first film formed over the terminal portion is removed by laser irradiation.

4. A manufacturing method of a semiconductor device, comprising the steps of:

forming a base film over a substrate;

forming a peeling layer over the base film;

forming a contaminant prevention film over the peeling layer;

forming an element layer provided with a test element including a thin film transistor and a terminal portion, over the contaminant prevention film;

forming a layer for securing strength of the element layer, over the element layer;

selectively removing the peeling layer, the contaminant prevention film, the element layer, and the layer for securing strength of the element layer and forming an opening portion;

separating the contaminant prevention film, the element layer, and the layer for securing strength of the element layer from the substrate;

sealing the contaminant prevention film, the element layer, and the layer for securing strength of the element layer with a first film having flexibility and a second film having flexibility;

removing the first film and the layer for securing strength of the element layer over the terminal portion to form a contact hole reaching the terminal portion;

filling the contact hole with a resin containing a conductive material; and heating after arranging a wiring substrate having flexibility over the resin with which filling has been performed so that the terminal portion and the wiring substrate having flexibility are adhered to each other through the resin containing the conductive material.

5. A manufacturing method of a semiconductor device, comprising the steps of:

forming a base film over a substrate;

forming a peeling layer over the base film;

forming a contaminant prevention film over the peeling layer;

forming an element layer provided with a test element including a thin film transistor and a terminal portion, over the contaminant prevention film;

forming a layer for securing strength of the element layer, over the element layer;

selectively removing the peeling layer, the contaminant prevention film, the element layer, and the layer for securing strength of the element layer and forming an opening portion;

separating the contaminant prevention film, the element layer, and the layer for securing strength of the element layer from the substrate;

sealing the contaminant prevention film, the element layer, and the layer for securing strength of the element layer with a first film having flexibility and a second film having flexibility;

removing the first film and the layer for securing strength of the element layer over the terminal portion to expose the terminal portion; and adhering the exposed terminal portion and a wiring substrate having flexibility to each other by using an anisotropic conductive film.

6. A manufacturing method of a semiconductor device, comprising the steps of:

forming a peeling layer over a substrate;

forming an element layer provided with a thin film transistor and an antenna having a terminal portion over the substrate;

selectively removing the peeling layer and the element layer to form an opening portion;

separating the thin film transistor and the antenna from the substrate, sealing the thin film transistor and the antenna with a first film having flexibility and a second film having flexibility;

removing the first film to expose the terminal portion; and adhering the exposed terminal portion and a wiring to each other.

7. The manufacturing method of a semiconductor device according to any one of claims 4 and 5, wherein the first film and the layer for securing strength of the element layer formed over the terminal portion are removed by laser irradiation.

8. The manufacturing method of a semiconductor device according to any one of claims 4 and 5, wherein at least one selected from the group consisting of silicon oxide, silicon nitride, silicon oxynitride, and silicon nitride oxide is used for the base film.

9. The manufacturing method of a semiconductor device according to any one of claims 4 and 5, wherein any one of an organic material and an inorganic material is used for the layer for securing strength of the element layer.

10. The manufacturing method of a semiconductor device according to any one of claims 1, 2, 4, 5 and 6, wherein a metal film containing at least one selected from the group consisting of tungsten, molybdenum, niobium, titanium, and silicon is used as the peeling layer.

11. The manufacturing method of a semiconductor device according to any one of claims 1, 2, 4, 5 and 6, wherein the element layer is provided between the first film having flexibility and the second film having flexibility.

12. The manufacturing method of a semiconductor device according to claim 6, wherein the thin film transistor and the antenna are provided between the first film having flexibility and the second film having flexibility.

* * * * *